United States Patent
Marcinkiewicz et al.

(10) Patent No.: US 10,320,322 B2
(45) Date of Patent: Jun. 11, 2019

(54) SWITCH ACTUATION MEASUREMENT CIRCUIT FOR VOLTAGE CONVERTER

(71) Applicant: Emerson Climate Technologies, Inc., Sidney, OH (US)

(72) Inventors: Joseph G. Marcinkiewicz, St. Peters, MO (US); Charles E. Green, Fenton, MO (US)

(73) Assignee: Emerson Climate Technologies, Inc., Sidney, OH (US)

( * ) Notice: Subject to any disclaimer, the term of this patent is extended or adjusted under 35 U.S.C. 154(b) by 0 days.

(21) Appl. No.: 15/487,101

(22) Filed: Apr. 13, 2017

(65) Prior Publication Data

US 2017/0302214 A1    Oct. 19, 2017

Related U.S. Application Data

(60) Provisional application No. 62/323,607, filed on Apr. 15, 2016, provisional application No. 62/323,532, (Continued)

(51) Int. Cl.
*H02M 1/34*    (2007.01)
*H02M 1/42*    (2007.01)
(Continued)

(52) U.S. Cl.
CPC ............. *H02P 27/08* (2013.01); *F04B 13/00* (2013.01); *F04B 17/03* (2013.01); *F04B 35/04* (2013.01);
(Continued)

(58) Field of Classification Search
None
See application file for complete search history.

(56) References Cited

U.S. PATENT DOCUMENTS

| | | |
|---|---|---|
| 4,388,578 A | 6/1983 | Green et al. |
| 4,437,146 A | 3/1984 | Carpenter |

(Continued)

FOREIGN PATENT DOCUMENTS

| | | |
|---|---|---|
| CN | 103822334 A | 5/2014 |
| EP | 0744816 A2 | 11/1996 |

(Continued)

OTHER PUBLICATIONS

Interview Summary regarding U.S. Appl. No. 15/419,394 dated Jan. 29, 2018.

(Continued)

*Primary Examiner* — Bickey Dhakal
*Assistant Examiner* — Zemenay T Truneh
(74) *Attorney, Agent, or Firm* — Harness, Dickey & Pierce, P.L.C.

(57) ABSTRACT

A drive includes an inverter power circuit that applies power to an electric motor of a compressor from a direct current (DC) voltage bus. A power factor correction (PFC) circuit outputs power to the DC voltage bus based on input alternating current (AC) power. The PFC circuit includes: (i) a switch having a first terminal, a second terminal, and a control terminal; (ii) a driver that switches the switch between open and closed states based on a control signal; (iii) an inductor that charges and discharges based on switching of the switch; and (iv) a circuit that outputs a signal indicating whether the switch is in the open state or the closed state based on a voltage across the first and second terminals of the switch.

16 Claims, 12 Drawing Sheets

Related U.S. Application Data filed on Apr. 15, 2016, provisional application No. 62/323,563, filed on Apr. 15, 2016.

(51) Int. Cl.

| | | |
|---|---|---|
| *H02M 1/44* | (2007.01) | |
| *F04B 13/00* | (2006.01) | |
| *F04B 17/03* | (2006.01) | |
| *F04B 35/04* | (2006.01) | |
| *F04B 49/06* | (2006.01) | |
| *F04B 49/10* | (2006.01) | |
| *F04B 49/20* | (2006.01) | |
| *F04C 28/28* | (2006.01) | |
| *F04C 29/00* | (2006.01) | |
| *F25B 31/02* | (2006.01) | |
| *F25B 49/02* | (2006.01) | |
| *H02P 23/26* | (2016.01) | |
| *H02P 27/06* | (2006.01) | |
| *H02P 27/08* | (2006.01) | |
| *F04C 18/02* | (2006.01) | |

(52) U.S. Cl.
CPC .............. *F04B 49/06* (2013.01); *F04B 49/10* (2013.01); *F04B 49/20* (2013.01); *F04C 28/28* (2013.01); *F04C 29/0085* (2013.01); *F25B 31/02* (2013.01); *F25B 49/025* (2013.01); *H02M 1/42* (2013.01); *H02M 1/4225* (2013.01); *H02M 1/44* (2013.01); *H02P 23/26* (2016.02); *H02P 27/06* (2013.01); *F04C 18/0215* (2013.01); *F04C 2240/40* (2013.01); *F25B 2600/021* (2013.01); *F25B 2700/21152* (2013.01); *H02M 1/4208* (2013.01); *H02M 2001/344* (2013.01); *Y02B 30/741* (2013.01); *Y02B 70/126* (2013.01)

(56) References Cited

U.S. PATENT DOCUMENTS

| | | |
|---|---|---|
| 4,504,922 A | 3/1985 | Johnson et al. |
| 4,939,473 A | 7/1990 | Eno |
| 5,367,617 A | 11/1994 | Goossen et al. |
| 5,410,360 A | 4/1995 | Montgomery |
| 5,493,101 A | 2/1996 | Innes |
| 5,506,484 A | 4/1996 | Munro et al. |
| 5,583,420 A | 12/1996 | Rice et al. |
| 5,594,635 A | 1/1997 | Gegner |
| 5,600,233 A | 2/1997 | Warren et al. |
| 5,754,036 A | 5/1998 | Walker |
| 5,801,516 A | 9/1998 | Rice et al. |
| 5,823,004 A | 10/1998 | Polley et al. |
| 5,903,130 A | 5/1999 | Rice et al. |
| 6,018,200 A | 1/2000 | Anderson et al. |
| 6,031,749 A | 2/2000 | Covington et al. |
| 6,115,051 A | 9/2000 | Simons et al. |
| 6,137,253 A | 10/2000 | Galbiati et al. |
| 6,158,887 A | 12/2000 | Simpson |
| 6,169,670 B1 | 1/2001 | Okubo et al. |
| 6,181,587 B1 | 1/2001 | Kuramoto et al. |
| 6,188,203 B1 | 2/2001 | Rice et al. |
| 6,215,287 B1 | 4/2001 | Matsushiro et al. |
| 6,239,523 B1 | 5/2001 | Janicek et al. |
| 6,249,104 B1 | 6/2001 | Janicek |
| 6,281,658 B1 | 8/2001 | Han et al. |
| 6,282,910 B1 | 9/2001 | Helt |
| 6,295,215 B1 | 9/2001 | Faria et al. |
| 6,307,759 B1 | 10/2001 | Inarida et al. |
| 6,309,385 B1 | 10/2001 | Simpson |
| 6,313,602 B1 | 11/2001 | Arefeen et al. |
| 6,384,579 B2 | 5/2002 | Watanabe |
| 6,433,504 B1 | 8/2002 | Branecky |
| 6,437,997 B1 | 8/2002 | Inarida et al. |
| 6,476,663 B1 | 11/2002 | Gauthier et al. |
| 6,483,265 B1 | 11/2002 | Hollenbeck et al. |
| 6,498,451 B1 | 12/2002 | Boules et al. |
| 6,515,437 B1 | 2/2003 | Zinkler et al. |
| 6,556,462 B1 | 4/2003 | Steigerwald et al. |
| 6,586,904 B2 | 7/2003 | McClelland et al. |
| 6,593,881 B2 | 7/2003 | Vail et al. |
| 6,629,776 B2 | 10/2003 | Bell et al. |
| 6,693,407 B2 | 2/2004 | Atmur |
| 6,693,409 B2 | 2/2004 | Lynch et al. |
| 6,710,573 B2 | 3/2004 | Kadah |
| 6,717,457 B2 | 4/2004 | Nanba et al. |
| 6,737,833 B2 | 5/2004 | Kalman et al. |
| 6,781,802 B2 | 8/2004 | Kato et al. |
| 6,801,028 B2 | 10/2004 | Kernahan et al. |
| 6,806,676 B2 | 10/2004 | Papiernik et al. |
| 6,810,292 B1 | 10/2004 | Rappenecker et al. |
| 6,859,008 B1 | 2/2005 | Seibel |
| 6,885,161 B2 | 4/2005 | de Nanclares et al. |
| 6,885,568 B2 | 4/2005 | Kernahan et al. |
| 6,900,607 B2 | 5/2005 | Kleinau et al. |
| 6,902,117 B1 | 6/2005 | Rosen |
| 6,906,500 B2 | 6/2005 | Kernahan |
| 6,906,933 B2 | 6/2005 | Taimela |
| 6,909,266 B2 | 6/2005 | Kernahan et al. |
| 6,930,459 B2 | 8/2005 | Fritsch et al. |
| 6,949,915 B2 | 9/2005 | Stanley |
| 6,952,089 B2 | 10/2005 | Matsuo |
| 6,961,015 B2 | 11/2005 | Kernahan et al. |
| 6,979,967 B2 | 12/2005 | Ho |
| 6,979,987 B2 | 12/2005 | Kernahan et al. |
| 6,984,948 B2 | 1/2006 | Nakata et al. |
| 7,015,679 B2 | 3/2006 | Ryba et al. |
| 7,053,569 B2 | 5/2006 | Takahashi et al. |
| 7,061,195 B2 | 6/2006 | Ho et al. |
| 7,068,016 B2 | 6/2006 | Athari |
| 7,068,191 B2 | 6/2006 | Kuner et al. |
| 7,071,641 B2 | 7/2006 | Arai et al. |
| 7,081,733 B2 | 7/2006 | Han et al. |
| 7,112,940 B2 | 9/2006 | Shimozono et al. |
| 7,135,830 B2 | 11/2006 | El-Ibiary |
| 7,148,664 B2 | 12/2006 | Takahashi et al. |
| 7,149,644 B2 | 12/2006 | Kobayashi et al. |
| 7,154,238 B2 | 12/2006 | Kinukawa et al. |
| 7,164,590 B2 | 1/2007 | Li et al. |
| 7,176,644 B2 | 2/2007 | Ueda et al. |
| 7,180,273 B2 | 2/2007 | Bocchiola et al. |
| 7,181,923 B2 | 2/2007 | Kurita et al. |
| 7,193,383 B2 | 3/2007 | Sarlioglu et al. |
| 7,202,626 B2 | 4/2007 | Jadric et al. |
| 7,208,891 B2 | 4/2007 | Jadric et al. |
| 7,221,121 B2 | 5/2007 | Skaug et al. |
| 7,239,257 B1 | 7/2007 | Alexander et al. |
| 7,256,564 B2 | 8/2007 | MacKay |
| 7,274,241 B2 | 9/2007 | Ho et al. |
| 7,309,977 B2 | 12/2007 | Gray et al. |
| 7,330,011 B2 | 2/2008 | Ueda et al. |
| 7,336,514 B2 | 2/2008 | Amarillas et al. |
| 7,339,346 B2 | 3/2008 | Ta et al. |
| 7,358,706 B2 | 4/2008 | Lys |
| 7,359,224 B2 | 4/2008 | Li |
| 7,425,806 B2 | 9/2008 | Schnetzka et al. |
| 7,459,864 B2 | 12/2008 | Lys |
| 7,463,006 B2 | 12/2008 | Ta et al. |
| 7,495,404 B2 | 2/2009 | Sarlioglu et al. |
| 7,508,688 B2 | 3/2009 | Virolainen |
| 7,532,491 B2 | 5/2009 | Lim et al. |
| 7,573,275 B2 | 8/2009 | Inagaki et al. |
| 7,592,820 B2 | 9/2009 | Laakso et al. |
| 7,598,698 B2 | 10/2009 | Hashimoto et al. |
| 7,612,522 B2 | 11/2009 | Williams et al. |
| 7,613,018 B2 | 11/2009 | Lim et al. |
| 7,616,466 B2 | 11/2009 | Chakrabarti et al. |
| 7,633,249 B2 | 12/2009 | Sekimoto et al. |
| 7,650,760 B2 | 1/2010 | Nakata et al. |
| 7,659,678 B2 | 2/2010 | Maiocchi |
| 7,667,986 B2 | 2/2010 | Artusi et al. |
| 7,671,557 B2 | 3/2010 | Maeda et al. |
| 7,675,759 B2 | 3/2010 | Artusi et al. |

(56) References Cited

U.S. PATENT DOCUMENTS

| | | |
|---|---|---|
| 7,723,964 B2 | 5/2010 | Taguchi |
| 7,750,595 B2 | 7/2010 | Yamada et al. |
| 7,771,115 B2 | 8/2010 | Pan |
| 7,847,507 B2 | 12/2010 | Wagoner |
| 7,880,430 B2 | 2/2011 | Gale et al. |
| 7,888,922 B2 | 2/2011 | Melanson |
| 7,903,441 B2 | 3/2011 | Chen et al. |
| 7,952,293 B2 | 5/2011 | Kelly |
| 7,966,079 B2 | 6/2011 | Graves |
| 7,966,081 B2 | 6/2011 | Graves |
| 8,032,323 B2 | 10/2011 | Taylor |
| 8,040,703 B2 | 10/2011 | Melanson |
| 8,044,623 B2 | 10/2011 | Takeuchi et al. |
| 8,050,063 B2 | 11/2011 | Wagoner et al. |
| 8,054,033 B2 | 11/2011 | Kern et al. |
| 8,065,023 B2 | 11/2011 | Graves |
| 8,072,170 B2 | 12/2011 | Hwang et al. |
| 8,092,084 B2 | 1/2012 | Riddle et al. |
| 8,096,139 B2 | 1/2012 | Taras et al. |
| 8,120,299 B2 | 2/2012 | Hwang et al. |
| 8,130,522 B2 | 3/2012 | Maksimovic |
| 8,154,230 B2 | 4/2012 | Kimura |
| 8,164,292 B2 | 4/2012 | Park |
| 8,169,180 B2 | 5/2012 | Hwang et al. |
| 8,174,853 B2 | 5/2012 | Kane et al. |
| 8,182,245 B2 | 5/2012 | Maeda et al. |
| 8,193,756 B2 | 6/2012 | Jadric et al. |
| 8,223,508 B2 | 7/2012 | Baarman et al. |
| 8,228,700 B2 | 7/2012 | Yahata et al. |
| 8,264,192 B2 | 9/2012 | Green et al. |
| 8,264,860 B2 | 9/2012 | Green |
| 8,269,370 B2 | 9/2012 | Haga |
| 8,278,778 B2 | 10/2012 | Rockenfeller et al. |
| 8,288,985 B2 | 10/2012 | Takahashi |
| 8,292,503 B2 | 10/2012 | Pan |
| 8,299,653 B2 | 10/2012 | Rockenfeller et al. |
| 8,305,780 B2 | 11/2012 | Saruwatari et al. |
| 8,320,145 B2 | 11/2012 | Horii |
| 8,321,039 B2 | 11/2012 | Graves |
| 8,335,095 B2 | 12/2012 | Mi et al. |
| 8,344,638 B2 | 1/2013 | Shteynberg et al. |
| 8,345,454 B1 | 1/2013 | Krolak et al. |
| 8,358,098 B2 | 1/2013 | Skinner et al. |
| 8,395,874 B2 | 3/2013 | Yamai et al. |
| 8,400,089 B2 | 3/2013 | Bonner et al. |
| 8,406,021 B2 | 3/2013 | Green |
| 8,432,108 B2 | 4/2013 | Kelly et al. |
| 8,432,713 B2 | 4/2013 | Popescu et al. |
| 8,467,197 B2 | 6/2013 | Perisic et al. |
| 8,477,514 B2 | 7/2013 | Artusi et al. |
| 8,477,517 B2 | 7/2013 | Joshi |
| 8,487,601 B2 | 7/2013 | Saint-Pierre |
| 8,493,014 B2 | 7/2013 | Henderson et al. |
| 8,508,165 B2 | 8/2013 | Shinomoto et al. |
| 8,508,166 B2 | 8/2013 | Marcinkiewicz et al. |
| 8,520,415 B1 | 8/2013 | Krishnamoorthy et al. |
| 8,520,420 B2 | 8/2013 | Jungreis et al. |
| 8,547,024 B2 | 10/2013 | Grotkowski et al. |
| 8,547,713 B2 | 10/2013 | Kono et al. |
| 8,564,982 B2 | 10/2013 | Song et al. |
| 8,582,263 B2 | 11/2013 | Butler |
| 8,587,962 B2 | 11/2013 | Perisic et al. |
| 8,599,577 B2 | 12/2013 | Kajouke et al. |
| 8,614,562 B2 | 12/2013 | Bouchez et al. |
| 8,633,668 B2 | 1/2014 | Marcoccia |
| 8,638,074 B2 | 1/2014 | Babcock et al. |
| 8,648,558 B2 | 2/2014 | Clothier et al. |
| 8,657,585 B2 | 2/2014 | Hong et al. |
| 8,669,805 B2 | 3/2014 | Serventi et al. |
| 8,693,228 B2 | 4/2014 | Matan et al. |
| 8,698,433 B2 | 4/2014 | Green |
| 8,704,409 B2 | 4/2014 | Owens |
| 8,736,207 B2 | 5/2014 | Ritter et al. |
| 8,749,222 B2 | 6/2014 | Williams |
| 8,751,374 B2 | 6/2014 | Graves |
| 8,760,089 B2 | 6/2014 | Smith |
| 8,760,096 B2 | 6/2014 | Inamura et al. |
| 8,767,418 B2 | 7/2014 | Jungreis et al. |
| 8,773,052 B2 | 7/2014 | Clothier et al. |
| 8,796,967 B2 | 8/2014 | Sato |
| 8,817,506 B2 | 8/2014 | Shimomugi et al. |
| 8,823,292 B2 | 9/2014 | Sumi et al. |
| 8,829,976 B2 | 9/2014 | Kuwabara et al. |
| 8,836,253 B2 | 9/2014 | Kato et al. |
| 8,847,503 B2 | 9/2014 | Chang et al. |
| 8,866,459 B2 | 10/2014 | Zilberberg |
| 8,884,560 B2 | 11/2014 | Ito |
| 8,896,248 B2 | 11/2014 | Becerra et al. |
| 8,928,262 B2 | 1/2015 | Chretien |
| 8,933,654 B2 | 1/2015 | Chen et al. |
| 8,937,821 B2 | 1/2015 | Amano et al. |
| 8,941,347 B2 | 1/2015 | Otorii et al. |
| 8,941,365 B2 | 1/2015 | Murdock et al. |
| 8,976,551 B2 | 3/2015 | Igarashi et al. |
| 9,020,731 B2 | 4/2015 | Yamada |
| 9,030,143 B2 | 5/2015 | Guzelgunler |
| 9,065,365 B2 | 6/2015 | Omata et al. |
| 9,065,367 B2 | 6/2015 | Greetham |
| 9,070,224 B1 | 6/2015 | Esfahbod MirHosseinZadeh Sarabi et al. |
| 9,071,186 B2 | 6/2015 | Wu et al. |
| 9,088,232 B2 | 7/2015 | Marcinkiewicz et al. |
| 9,088,237 B2 | 7/2015 | Sanchez et al. |
| 9,093,941 B2 | 7/2015 | Lawrence et al. |
| 9,100,019 B2 | 8/2015 | Akiyama |
| 9,109,959 B2 | 8/2015 | Nieddu et al. |
| 9,118,260 B2 | 8/2015 | Gautier et al. |
| 9,124,095 B1 | 9/2015 | Barron et al. |
| 9,124,200 B2 | 9/2015 | Dai |
| 9,130,493 B2 | 9/2015 | Chen et al. |
| 9,134,183 B2 | 9/2015 | Jeong et al. |
| 9,136,757 B2 | 9/2015 | Arisawa et al. |
| 9,136,790 B2 | 9/2015 | Park et al. |
| 9,185,768 B2 | 11/2015 | Navabi-Shirazi et al. |
| 9,188,491 B2 | 11/2015 | Pan |
| 9,190,926 B2 | 11/2015 | Taguchi |
| 9,197,132 B2 | 11/2015 | Artusi et al. |
| 9,214,881 B2 | 12/2015 | Sekimoto et al. |
| 9,225,258 B2 | 12/2015 | Shimomugi et al. |
| 9,225,284 B2 | 12/2015 | Ried |
| 9,240,739 B2 | 1/2016 | Fukuta et al. |
| 9,246,398 B2 | 1/2016 | Sakakibara et al. |
| 9,246,418 B2 | 1/2016 | Becker et al. |
| 9,247,608 B2 | 1/2016 | Chitta et al. |
| 9,250,299 B1 | 2/2016 | Yarlagadda et al. |
| 9,257,931 B2 | 2/2016 | Tooyama et al. |
| 9,300,241 B2 | 3/2016 | Becerra et al. |
| 9,312,780 B2 | 4/2016 | Taguchi |
| 9,322,717 B1 | 4/2016 | Dhaliwal et al. |
| 9,322,867 B2 | 4/2016 | Chatroux et al. |
| 9,325,517 B2 | 4/2016 | Grohman |
| 9,331,598 B2 | 5/2016 | Jeong et al. |
| 9,331,614 B2 | 5/2016 | Becerra et al. |
| 9,387,800 B2 | 7/2016 | Tran |
| 9,407,093 B2 | 8/2016 | Cummings |
| 9,407,135 B2 | 8/2016 | Kinomura et al. |
| 9,419,513 B2 | 8/2016 | Mao et al. |
| 9,425,610 B2 | 8/2016 | Nakashita et al. |
| 9,431,915 B2 | 8/2016 | Arisawa et al. |
| 9,431,923 B2 | 8/2016 | Harada et al. |
| 9,438,029 B2 | 9/2016 | Cameron |
| 9,444,331 B2 | 9/2016 | Carletti et al. |
| 9,461,577 B2 | 10/2016 | Ried |
| 9,479,070 B2 | 10/2016 | van der Merwe |
| 9,502,981 B2 | 11/2016 | Schaemann et al. |
| 9,504,105 B2 | 11/2016 | Ekbote et al. |
| 9,560,718 B2 | 1/2017 | Sadwick |
| 9,564,846 B2 | 2/2017 | Marcinkiewicz et al. |
| 9,564,848 B2 | 2/2017 | Ishizeki et al. |
| 9,565,731 B2 | 2/2017 | DeJonge |
| 9,577,534 B2 | 2/2017 | Ishizeki et al. |
| 9,580,858 B2 | 2/2017 | Maekawa et al. |
| 9,581,626 B2 | 2/2017 | Schwind |
| 9,595,889 B2 | 3/2017 | Li et al. |

(56) References Cited

U.S. PATENT DOCUMENTS

| | | |
|---|---|---|
| 9,618,249 B2 | 4/2017 | Hatakeyama et al. |
| 9,621,101 B2 | 4/2017 | Kane |
| 9,625,190 B2 | 4/2017 | Lee et al. |
| 9,634,602 B2 | 4/2017 | Hou et al. |
| 9,640,617 B2 | 5/2017 | Das et al. |
| 9,641,063 B2 | 5/2017 | Ramabhadran et al. |
| 9,641,115 B2 | 5/2017 | Chretien |
| 9,654,048 B2 | 5/2017 | West et al. |
| 9,667,169 B2 | 5/2017 | Nawa et al. |
| 9,683,904 B2 | 6/2017 | Matsumoto et al. |
| 9,692,312 B2 | 6/2017 | Yuasa et al. |
| 9,692,332 B2 | 6/2017 | Taoka et al. |
| 9,696,693 B2 | 7/2017 | Element |
| 9,698,768 B2 | 7/2017 | Leong et al. |
| 9,712,071 B2 | 7/2017 | Yuasa et al. |
| 9,715,913 B1 | 7/2017 | Yin et al. |
| 9,722,488 B2 | 8/2017 | Ishizeki et al. |
| 9,732,991 B2 | 8/2017 | An et al. |
| 9,741,182 B2 | 8/2017 | Zhu |
| 9,742,319 B2 | 8/2017 | Marvelly et al. |
| 9,742,346 B2 | 8/2017 | Esnault |
| 9,746,812 B2 | 8/2017 | Kosaka |
| 9,762,119 B2 | 9/2017 | Kim et al. |
| 9,772,131 B2 | 9/2017 | Hatakeyama et al. |
| 9,772,381 B2 | 9/2017 | Bock et al. |
| 9,780,683 B2 | 10/2017 | Sakakibara et al. |
| 9,787,175 B2 | 10/2017 | Phadke |
| 9,787,246 B2 | 10/2017 | Tsumura et al. |
| 9,791,327 B2 | 10/2017 | Rhee et al. |
| 9,800,138 B2 | 10/2017 | Katsumata |
| 9,813,000 B2 | 11/2017 | Jabusch et al. |
| 9,816,743 B2 | 11/2017 | Nakase et al. |
| 9,819,294 B2 | 11/2017 | Park et al. |
| 9,823,105 B2 | 11/2017 | Lehmkuhl et al. |
| 9,829,226 B2 | 11/2017 | Hatakeyama et al. |
| 9,829,234 B2 | 11/2017 | Hatakeyama et al. |
| 9,837,952 B1 | 12/2017 | Carcia et al. |
| 9,839,103 B2 | 12/2017 | Avrahamy |
| 9,852,559 B2 | 12/2017 | Rettig et al. |
| 9,853,559 B2 | 12/2017 | Taniguchi et al. |
| 9,867,263 B2 | 1/2018 | Avrahamy |
| 9,870,009 B2 | 1/2018 | Erwin et al. |
| 9,882,466 B2 | 1/2018 | Kondo et al. |
| 9,888,535 B2 | 2/2018 | Chitta et al. |
| 9,888,540 B2 | 2/2018 | DeJonge |
| 9,893,522 B2 | 2/2018 | Wallace et al. |
| 9,893,603 B2 | 2/2018 | Nishizawa et al. |
| 9,893,668 B2 | 2/2018 | Hart et al. |
| 9,899,916 B2 | 2/2018 | Okamura et al. |
| 9,929,636 B2 | 3/2018 | Shinomoto et al. |
| 9,935,569 B2 | 4/2018 | Tsumura et al. |
| 9,935,571 B2 | 4/2018 | Frampton et al. |
| 9,941,834 B2 | 4/2018 | Tsukano et al. |
| 9,954,473 B2 | 4/2018 | Je et al. |
| 9,954,475 B2 | 4/2018 | Cho et al. |
| 9,965,928 B2 | 5/2018 | Green |
| 9,973,129 B2 | 5/2018 | Schuster et al. |
| 9,998,049 B2 | 6/2018 | Kashima et al. |
| 10,003,277 B2 | 6/2018 | Taguchi et al. |
| 10,014,858 B2 | 7/2018 | Flynn et al. |
| 2002/0085468 A1 | 7/2002 | Kobayashi |
| 2003/0021127 A1 | 1/2003 | Loef et al. |
| 2003/0117818 A1 | 6/2003 | Ota |
| 2003/0218448 A1 | 11/2003 | Lidak et al. |
| 2004/0136208 A1* | 7/2004 | Agarwal ............. H02M 1/4208 363/21.12 |
| 2004/0183513 A1 | 9/2004 | Vinciarelli |
| 2005/0017695 A1 | 1/2005 | Stanley |
| 2005/0017699 A1 | 1/2005 | Stanley |
| 2005/0028539 A1 | 2/2005 | Singh et al. |
| 2005/0068337 A1 | 3/2005 | Duarte et al. |
| 2005/0076659 A1 | 4/2005 | Wallace et al. |
| 2005/0109047 A1 | 5/2005 | Park et al. |
| 2005/0122082 A1 | 6/2005 | Eckardt |
| 2006/0022648 A1 | 2/2006 | Ben-Yaakov et al. |
| 2006/0245219 A1 | 11/2006 | Li |
| 2007/0036212 A1 | 2/2007 | Leung et al. |
| 2007/0217233 A1 | 9/2007 | Lim et al. |
| 2008/0104983 A1 | 5/2008 | Yamai et al. |
| 2008/0122418 A1 | 5/2008 | Briere et al. |
| 2008/0272748 A1 | 11/2008 | Melanson |
| 2008/0310201 A1 | 12/2008 | Maksimovic |
| 2009/0178424 A1 | 7/2009 | Hwang et al. |
| 2009/0273297 A1 | 11/2009 | Kelly |
| 2010/0117545 A1 | 5/2010 | Kelly et al. |
| 2010/0253295 A1 | 10/2010 | Tan et al. |
| 2010/0309700 A1 | 12/2010 | Maeda et al. |
| 2011/0012526 A1 | 1/2011 | Kelly |
| 2011/0015788 A1 | 1/2011 | Celik et al. |
| 2011/0030396 A1 | 2/2011 | Marcinkiewicz et al. |
| 2011/0030398 A1 | 2/2011 | Marcinkiewicz et al. |
| 2011/0031911 A1* | 2/2011 | Marcinkiewicz ... H02M 1/4225 318/400.3 |
| 2011/0031920 A1* | 2/2011 | Henderson .......... H02P 21/0089 318/434 |
| 2011/0031942 A1 | 2/2011 | Green |
| 2011/0031943 A1 | 2/2011 | Green |
| 2011/0034176 A1 | 2/2011 | Lord et al. |
| 2011/0141774 A1 | 6/2011 | Kane et al. |
| 2011/0164339 A1 | 7/2011 | Schmid et al. |
| 2011/0204820 A1 | 8/2011 | Tikkanen et al. |
| 2011/0205161 A1 | 8/2011 | Myers et al. |
| 2011/0304279 A1 | 12/2011 | Felty |
| 2012/0013282 A1 | 1/2012 | Introwicz |
| 2012/0075310 A1 | 3/2012 | Michail et al. |
| 2012/0153396 A1 | 6/2012 | Sugiura et al. |
| 2012/0153916 A1 | 6/2012 | Weinstein et al. |
| 2012/0179299 A1 | 7/2012 | Gyota et al. |
| 2012/0280637 A1 | 11/2012 | Tikkanen et al. |
| 2012/0313646 A1 | 12/2012 | Nishikawa |
| 2013/0010508 A1 | 1/2013 | Courtel |
| 2013/0020310 A1 | 1/2013 | Hacham |
| 2013/0182470 A1 | 7/2013 | Chen et al. |
| 2014/0001993 A1 | 1/2014 | Iwata et al. |
| 2014/0015463 A1 | 1/2014 | Merkel et al. |
| 2014/0077770 A1 | 3/2014 | Omoto et al. |
| 2014/0091622 A1 | 4/2014 | Lucas et al. |
| 2014/0169046 A1 | 6/2014 | Chen |
| 2014/0292212 A1 | 10/2014 | Gray et al. |
| 2015/0043252 A1* | 2/2015 | Kuang .............. H02M 3/33507 363/21.16 |
| 2015/0084563 A1 | 3/2015 | Lucas et al. |
| 2015/0191133 A1 | 7/2015 | Okamura et al. |
| 2015/0214833 A1 | 7/2015 | Ramabhadran et al. |
| 2015/0219503 A1 | 8/2015 | Yoshida |
| 2015/0229204 A1 | 8/2015 | Mao et al. |
| 2015/0236581 A1 | 8/2015 | Chen et al. |
| 2015/0285691 A1 | 10/2015 | Caffee et al. |
| 2015/0326107 A1 | 11/2015 | Hsiao et al. |
| 2015/0333633 A1 | 11/2015 | Chen et al. |
| 2015/0354870 A1 | 12/2015 | Lee et al. |
| 2015/0365034 A1 | 12/2015 | Marcinkiewicz et al. |
| 2016/0013740 A1 | 1/2016 | Skinner et al. |
| 2016/0043632 A1 | 2/2016 | Tomioka |
| 2016/0043633 A1 | 2/2016 | Phadke |
| 2016/0094039 A1 | 3/2016 | Winstanley et al. |
| 2016/0133411 A1 | 5/2016 | Bock et al. |
| 2016/0218624 A1 | 7/2016 | Ishizeki et al. |
| 2016/0248365 A1* | 8/2016 | Ishizeki ................. H02M 1/36 |
| 2016/0261217 A1 | 9/2016 | Tang |
| 2016/0263331 A1 | 9/2016 | Nessel et al. |
| 2016/0268839 A1 | 9/2016 | Mouridsen |
| 2016/0268949 A1 | 9/2016 | Benn |
| 2016/0268951 A1 | 9/2016 | Cho et al. |
| 2016/0320249 A1 | 11/2016 | Reiman et al. |
| 2016/0329716 A1 | 11/2016 | Inoue |
| 2017/0141709 A1 | 5/2017 | Fukuda et al. |
| 2017/0141717 A1 | 5/2017 | Winstanley et al. |
| 2017/0155347 A1 | 6/2017 | Park et al. |
| 2017/0190530 A1 | 7/2017 | Seki et al. |
| 2017/0201201 A1 | 7/2017 | Aoki et al. |
| 2017/0205103 A1 | 7/2017 | Newcomb |
| 2017/0214341 A1 | 7/2017 | Matthews et al. |
| 2017/0244325 A1 | 8/2017 | Carralero et al. |

(56) References Cited

U.S. PATENT DOCUMENTS

| | | |
|---|---|---|
| 2017/0264223 A1 | 9/2017 | Kitano et al. |
| 2017/0288561 A1 | 10/2017 | Lemberg et al. |
| 2017/0299444 A1 | 10/2017 | Green |
| 2017/0300107 A1 | 10/2017 | Green et al. |
| 2017/0301192 A1 | 10/2017 | Green |
| 2017/0302158 A1 | 10/2017 | Green |
| 2017/0302159 A1 | 10/2017 | Green et al. |
| 2017/0302160 A1 | 10/2017 | Marcinkiewicz et al. |
| 2017/0302161 A1 | 10/2017 | Green |
| 2017/0302162 A1 | 10/2017 | Green |
| 2017/0302165 A1 | 10/2017 | Marcinkiewicz et al. |
| 2017/0302200 A1 | 10/2017 | Marcinkiewicz |
| 2017/0302212 A1 | 10/2017 | Marcinkiewicz et al. |
| 2017/0317623 A1 | 11/2017 | Taniguchi et al. |
| 2017/0317637 A1 | 11/2017 | VanEyll et al. |
| 2017/0324362 A1 | 11/2017 | Colangelo et al. |
| 2017/0328786 A1 | 11/2017 | Takechi |
| 2017/0373629 A1 | 12/2017 | Shin et al. |
| 2018/0026544 A1 | 1/2018 | Baumann et al. |
| 2018/0034403 A1 | 2/2018 | Kim et al. |
| 2018/0062551 A1 | 3/2018 | Moon et al. |
| 2018/0073934 A1 | 3/2018 | Horng et al. |
| 2018/0076748 A1 | 3/2018 | Yamasaki et al. |
| 2018/0082991 A1 | 3/2018 | Toyoda et al. |
| 2018/0091075 A1 | 3/2018 | Musil |
| 2018/0094512 A1 | 4/2018 | Sadilek et al. |
| 2018/0175752 A1 | 6/2018 | Takeoka et al. |
| 2018/0180490 A1 | 6/2018 | Barbier et al. |
| 2018/0191261 A1 | 7/2018 | Chung et al. |
| 2018/0191288 A1 | 7/2018 | Li et al. |

FOREIGN PATENT DOCUMENTS

| | | | |
|---|---|---|---|
| EP | 1271067 A1 | | 1/2003 |
| EP | 1641113 A1 | | 3/2006 |
| JP | H11237427 A | | 8/1999 |
| JP | 2006134607 A | | 5/2006 |
| JP | 2010541256 A | | 12/2010 |
| JP | 2011160508 A | | 8/2011 |
| JP | 2015080316 A | | 4/2015 |
| KR | 20040025420 A | | 3/2004 |
| KR | 20130067440 A | | 6/2013 |
| WO | WO-2007035407 A1 | | 3/2007 |
| WO | WO-2010143239 A1 | | 12/2010 |
| WO | WO-2011074972 A1 | | 6/2011 |

OTHER PUBLICATIONS

Office Action regarding U.S. Appl. No. 15/419,464 dated Dec. 29, 2017.
Office Action regarding U.S. Appl. No. 15/419,394, dated Dec. 7, 2017.
Office Action regarding U.S. Appl. No. 15/419,423 dated Jan. 8, 2018.
Office Action regarding U.S. Appl. No. 15/487,201 dated Jan. 9, 2018.
Advisory Action regarding U.S. Appl. No. 15/419,394 dated Mar. 12, 2018.
Applicant-Initiated Interview Summary regarding U.S. Appl. No. 15/487,201 dated Mar. 5, 2018.
Interview Summary regarding U.S. Appl. No. 15/419,423 dated Feb. 21, 2018.
Notice of Allowance regarding U.S. Appl. No. 15/430,978 dated Feb. 22, 2018.
Restriction Requirement regarding U.S. Appl. No. 15/487,226 dated Mar. 12, 2018.
International Search Report regarding International Application No. PCT/US2017/027710, dated Sep. 20, 2017.
Written Opinion of the International Searching Authority regarding International Application No. PCT/US2017/027710, dated Sep. 20, 2017.
Amit Kumar Sinha et al. "SEPIC Based PFC Converter for PMBLDCM Drive in Air Conditioning System." International Journal of Advanced Computer Research, vol. 3, No. 1, Issue 8. Mar. 2013.
International Search Report regarding International Application No. PCT/US2017/027721, dated Sep. 20, 2017.
Written Opinion of the International Searching Authority regarding International Application No. PCT/US2017/027721, dated Sep. 20, 2017.
International Search Report regarding International Application No. PCT/US2017/027699, dated Sep. 20, 2017.
Written Opinion of the International Searching Authority regarding International Application No. PCT/US2017/027699, dated Sep. 20, 2017.
International Search Report regarding International Application No. PCT/US2017/027691, dated Aug. 18, 2017.
Written Opinion of the International Searching Authority regarding International Application No. PCT/US2017/027691, dated Aug. 18, 2017.
International Search Report regarding International Application No. PCT/US2017/027744, dated Aug. 18, 2017.
Written Opinion of the International Searching Authority regarding International Application No. PCT/US2017/027744, dated Aug. 18, 2017.
International Search Report regarding International Application No. PCT/US2017/027738, dated Aug. 18, 2017.
Written Opinion of the International Searching Authority regarding International Application No. PCT/US2017/027738, dated Aug. 18, 2017.
Office Action regarding U.S. Appl. No. 15/419,394, dated Sep. 11, 2017.
Applicant-Initiated Interview Summary regarding U.S. Appl. No. 15/419,394, dated Oct. 30, 2017.
International Search Report regarding International Application No. PCT/US2017/027726, dated Sep. 12, 2017.
Written Opinion of the International Searching Authority regarding International Application No. PCT/US2017/027726, dated Sep. 12, 2017.
International Search Report regarding International Application No. PCT/US2017/027729, dated Sep. 13, 2017.
Written Opinion of the International Searching Authority regarding International Application No. PCT/US2017/027729, dated Sep. 13, 2017.
Notice of Allowance regarding U.S. Appl. No. 15/419,394 dated Jul. 20, 2018.
Notice of Allowance regarding U.S. Appl. No. 15/487,201 dated Jul. 20, 2018.
Final Office Action regarding U.S. Appl. No. 15/487,201 dated Apr. 19, 2018.
Restriction Requirement regarding U.S. Appl. No. 15/487,151 dated Apr. 5, 2018.
Non-Final Office Action regarding U.S. Appl. No. 15/419,423 dated May 14, 2018.
Notice of Allowance regarding U.S. Appl. No. 15/419,394 dated May 11, 2018.
Notice of Allowance regarding U.S. Appl. No. 15/419,464 dated May 11, 2018.
Applicant-Initiated Interview Summary regarding U.S. Appl. No. 15/487,027 dated Jun. 21, 2018.
Applicant-Initiated Interview Summary regarding U.S. Appl. No. 15/487,201 dated May 30, 2018.
Non-Final Office Action regarding U.S. Appl. No. 15/487,226 dated May 16, 2018.
Restriction Requirement regarding U.S. Appl. No. 15/487,175 dated May 16, 2018.
U.S. Appl. No. 15/419,349, filed Jan. 30, 2017, Charles E. Green.
U.S. Appl. No. 15/419,394, filed Jan. 30, 2017, Charles E. Green.
U.S. Appl. No. 15/419,423, filed Jan. 30, 2017, Charles E. Green.
U.S. Appl. No. 15/419,464, filed Jan. 30, 2017, Charles E. Green.
U.S. Appl. No. 15/487,027, filed Apr. 13, 2017, Joseph G. Marcinkiewicz.
U.S. Appl. No. 15/487,151, filed Apr. 13, 2017, Charles E. Green.
U.S. Appl. No. 15/487,175, filed Apr. 13, 2017, Joseph G. Marcinkiewicz.

(56) References Cited

OTHER PUBLICATIONS

U.S. Appl. No. 15/487,226, filed Apr. 13, 2017, Joseph G. Marcinkiewicz.
U.S. Appl. No. 15/943,660, filed Apr. 2, 2018, Charles E. Green.
Applicant-Initiated Interview Summary regarding U.S. Appl. No. 15/419,423 dated Aug. 9, 2018.
Applicant-Initiated Interview Summary regarding U.S. Appl. No. 15/419,423 dated Dec. 12, 2018.
Corrected Notice of Allowability regarding U.S. Appl. No. 15/419,394 dated Sep. 10, 2018.
Non-Final Office Action regarding U.S. Appl. No. 15/419,349 dated Oct. 18, 2018.
Non-Final Office Action regarding U.S. Appl. No. 15/419,423 dated Oct. 11, 2018.
Non-Final Office Action regarding U.S. Appl. No. 15/487,175 dated Jan. 10, 2019.
Notice of Allowance regarding U.S. Appl. No. 15/419,394 dated Aug. 27, 2018.
Notice of Allowance regarding U.S. Appl. No. 15/419,464 dated Sep. 24, 2018.
Notice of Allowance regarding U.S. Appl. No. 15/487,027 dated Oct. 2, 2018.
Notice of Allowance regarding U.S. Appl. No. 15/487,175 dated Oct. 3, 2018.
Notice of Allowance regarding U.S. Appl. No. 15/487,151 dated Oct. 25, 2018.

\* cited by examiner

SWITCH ACTUATION MEASUREMENT CIRCUIT FOR VOLTAGE CONVERTER

CROSS-REFERENCE TO RELATED APPLICATIONS

This application claims the benefit of U.S. Provisional Application Nos. 62/323,563, 62/323,532, and 62/323,607 all filed on Apr. 15, 2016. The entire disclosures of the applications referenced above are incorporated herein by reference.

FIELD

The present disclosure relates to a voltage converters and, more particularly, to circuits for measuring switching of a voltage converter.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Electric motors are used in a wide variety of industrial and residential applications including, but not limited to, heating, ventilating, and air conditioning (HVAC) systems. For example only, an electric motor may drive a compressor in an HVAC system. One or more additional electric motors may also be implemented in the HVAC system. For example only, the HVAC system may include another electric motor that drives a fan associated with a condenser. Another electric motor may be included in the HVAC system to drive a fan associated with an evaporator.

SUMMARY

In a feature, a drive is described. An inverter power circuit applies power to an electric motor of a compressor from a direct current (DC) voltage bus. A power factor correction (PFC) circuit outputs power to the DC voltage bus based on input alternating current (AC) power. The PFC circuit includes: (i) a switch having a first terminal, a second terminal, and a control terminal; (ii) a driver that switches the switch between open and closed states based on a control signal; (iii) an inductor that charges and discharges based on switching of the switch; and (iv) a circuit that outputs a signal indicating whether the switch is in the open state or the closed state based on a voltage across the first and second terminals of the switch.

In further features, the drive further includes a control module that generates the control signal based on the signal indicating whether the switch is in the open state or the closed state.

In further features, the control module measures a period between: (i) a first time when the control signal transitions from a first state for transitioning the switch one of: (a) from the open state to the closed state; and (b) from the closed state to the open state; and (i) a second time, after the first time, when the signal transitions from a first state to a second indicating that the one of: (a) the switch transitioned from the open state to the closed state; and (b) the switch transitioned from the closed state to the open state. The control module generates the control signal based on the period.

In further features, the circuit generates the signal indicating that the switch is in the closed state when the voltage across the first and second terminals of the switch is less than a predetermined voltage.

In further features, the circuit generates the signal indicating that the switch is in the open state when the voltage across the first and second terminals is greater than a predetermined voltage.

In further features, the second terminal of the switch is connected to a ground potential.

In further features, the circuit includes a node that is connected to a first voltage at the first terminal of the switch when the switch is in the closed state and that is connected to a second voltage when the switch is in the open state.

In further features, the circuit further includes: a first voltage divider that generates a third voltage based on a fourth voltage at the node; a second voltage divider that generates a fifth voltage based on a sixth voltage at the second terminal of the switch; and a comparator that generates the signal indicating whether the switch is in the open state or the closed state based on a comparison of the third voltage and the fifth voltage.

In further features, the comparator generates the signal indicating that the switch is in the open state when the third voltage is greater than the fifth voltage.

In further features, the comparator generates the signal indicating that the switch is in the closed state when the third voltage is less than the fifth voltage.

In a feature, a method includes: applying power to an electric motor of a compressor from a direct current (DC) voltage bus; and, by a power factor correction (PFC) circuit, providing power to the DC voltage bus based on input alternating current (AC) power, the providing power to the DC bus voltage including switching a switch of the PFC circuit between open and closed states based on a control signal, wherein the switch includes a first terminal, a second terminal, and the control terminal. The method further includes outputting a signal indicating whether the switch is in the open state or the closed state based on a voltage across the first and second terminals of the switch.

In further features, the method further includes generating the control signal based on the signal indicating whether the switch is in the open state or the closed state.

In further features, the method further includes measuring a period between: (i) a first time when the control signal transitions from a first state for transitioning the switch one of: (a) from the open state to the closed state; and (b) from the closed state to the open state; and (i) a second time, after the first time, when the signal transitions from a first state to a second indicating that the one of: (a) the switch transitioned from the open state to the closed state; and (b) the switch transitioned from the closed state to the open state. Generating the control signal includes generating the control signal based on the period.

In further features, outputting the signal indicating whether the switch is in the open state or the closed state includes generating the signal indicating that the switch is in the closed state when the voltage across the first and second terminals of the switch is less than a predetermined voltage.

In further features, outputting the signal indicating whether the switch is in the open state or the closed state includes generating the signal indicating that the switch is in the open state when the voltage across the first and second terminals is greater than a predetermined voltage.

In further features, the second terminal of the switch is connected to a ground potential.

In further features, the method further includes: connecting a node to a first voltage at the first terminal of the switch when the switch is in the closed state; and connecting the node to a second voltage when the switch is in the open state.

In further features, the method further includes: by a first voltage divider, generating a third voltage based on a fourth voltage at the node; and by a second voltage divider, generating a fifth voltage based on a sixth voltage at the second terminal of the switch. Outputting the signal indicating whether the switch is in the open state or the closed state includes outputting the signal indicating whether the switch is in the open state or the closed state based on a comparison of the third voltage and the fifth voltage.

In further features, outputting the signal indicating whether the switch is in the open state or the closed state includes generating the signal indicating that the switch is in the open state when the third voltage is greater than the fifth voltage.

In further features, outputting the signal indicating whether the switch is in the open state or the closed state includes generating the signal indicating that the switch is in the closed state when the third voltage is less than the fifth voltage.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Refrigeration System

Figure 1:
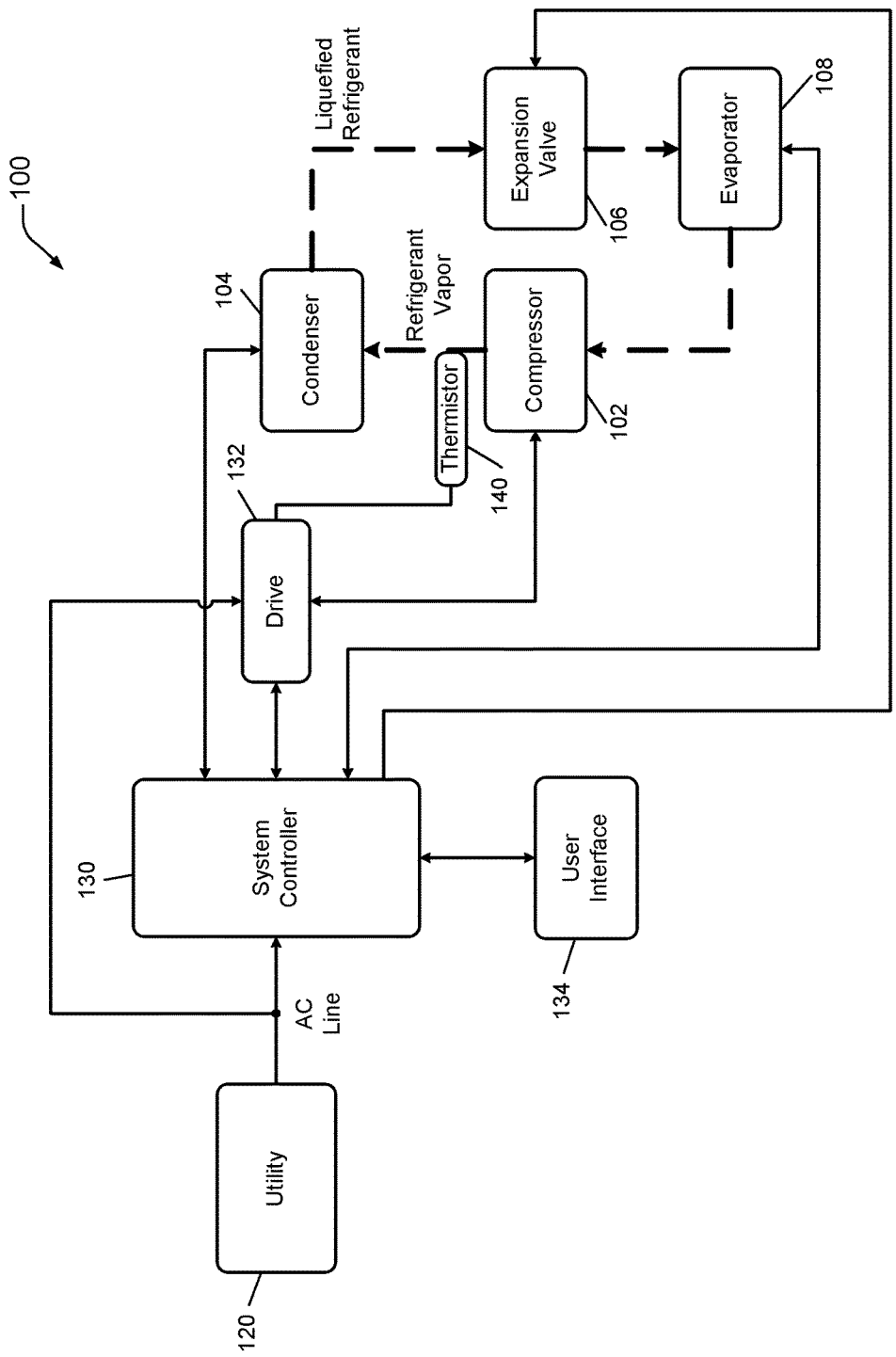
FIG. 1 is a functional block diagram of an example refrigeration system.

FIG. 1 is a functional block diagram of an example refrigeration system 100 including a compressor 102, a condenser 104, an expansion valve 106, and an evaporator 108. According to the principles of the present disclosure, the refrigeration system 100 may include additional and/or alternative components, such as a reversing valve or a filter-drier. In addition, the present disclosure is applicable to other types of refrigeration systems including, but not limited to, heating, ventilating, and air conditioning (HVAC), heat pump, refrigeration, and chiller systems.

The compressor 102 receives refrigerant in vapor form and compresses the refrigerant. The compressor 102 provides pressurized refrigerant in vapor form to the condenser 104. The compressor 102 includes an electric motor that drives a pump. For example only, the pump of the compressor 102 may include a scroll compressor and/or a reciprocating compressor.

All or a portion of the pressurized refrigerant is converted into liquid form within the condenser 104. The condenser 104 transfers heat away from the refrigerant, thereby cooling the refrigerant. When the refrigerant vapor is cooled to a temperature that is less than a saturation temperature, the refrigerant transforms into a liquid (or liquefied) refrigerant. The condenser 104 may include an electric fan that increases the rate of heat transfer away from the refrigerant.

The condenser 104 provides the refrigerant to the evaporator 108 via the expansion valve 106. The expansion valve 106 controls the flow rate at which the refrigerant is supplied to the evaporator 108. The expansion valve 106 may include a thermostatic expansion valve or may be controlled electronically by, for example, a system controller 130. A pressure drop caused by the expansion valve 106 may cause a portion of the liquefied refrigerant to transform back into the vapor form. In this manner, the evaporator 108 may receive a mixture of refrigerant vapor and liquefied refrigerant.

The refrigerant absorbs heat in the evaporator 108. Liquid refrigerant transitions into vapor form when warmed to a temperature that is greater than the saturation temperature of the refrigerant. The evaporator 108 may include an electric fan that increases the rate of heat transfer to the refrigerant.

A utility 120 provides power to the refrigeration system 100. For example only, the utility 120 may provide single-phase alternating current (AC) power at approximately 230 Volts root mean squared ($V_{RMS}$). In other implementations, the utility 120 may provide three-phase AC power at approximately 400 $V_{RMS}$, 480 $V_{RMS}$, or 600 $V_{RMS}$ at a line frequency of, for example, 50 or 60 Hz. When the three-phase AC power is nominally 600 $V_{RMS}$, the actual available voltage of the power may be 575 $V_{RMS}$.

The utility 120 may provide the AC power to the system controller 130 via an AC line, which includes two or more conductors. The AC power may also be provided to a drive 132 via the AC line. The system controller 130 controls the refrigeration system 100. For example only, the system controller 130 may control the refrigeration system 100 based on user inputs and/or parameters measured by various sensors (not shown). The sensors may include pressure sensors, temperature sensors, current sensors, voltage sensors, etc. The sensors may also include feedback information from the drive control, such as motor currents or torque, over a serial data bus or other suitable data buses.

A user interface 134 provides user inputs to the system controller 130. The user interface 134 may additionally or alternatively provide the user inputs directly to the drive 132. The user inputs may include, for example, a desired temperature, requests regarding operation of a fan (e.g., a request for continuous operation of the evaporator fan), and/or other suitable inputs. The user interface 134 may take the form of a thermostat, and some or all functions of the system controller (including, for example, actuating a heat source) may be incorporated into the thermostat.

The system controller 130 may control operation of the fan of the condenser 104, the fan of the evaporator 108, and the expansion valve 106. The drive 132 may control the compressor 102 based on commands from the system controller 130. For example only, the system controller 130 may instruct the drive 132 to operate the motor of the compressor 102 at a certain speed or to operate the compressor 102 at a certain capacity. In various implementations, the drive 132 may also control the condenser fan.

A thermistor 140 is thermally coupled to the refrigerant line exiting the compressor 102 that conveys refrigerant vapor to the condenser 104. The variable resistance of the thermistor 140 therefore varies with the discharge line temperature (DLT) of the compressor 102. As described in more detail, the drive 132 monitors the resistance of the thermistor 140 to determine the temperature of the refrigerant exiting the compressor 102.

The DLT may be used to control the compressor 102, such as by varying capacity of the compressor 102, and may also be used to detect a fault. For example, if the DLT exceeds the threshold, the drive 132 may power down the compressor 102 to prevent damage to the compressor 102.

Drive

Figure 2:
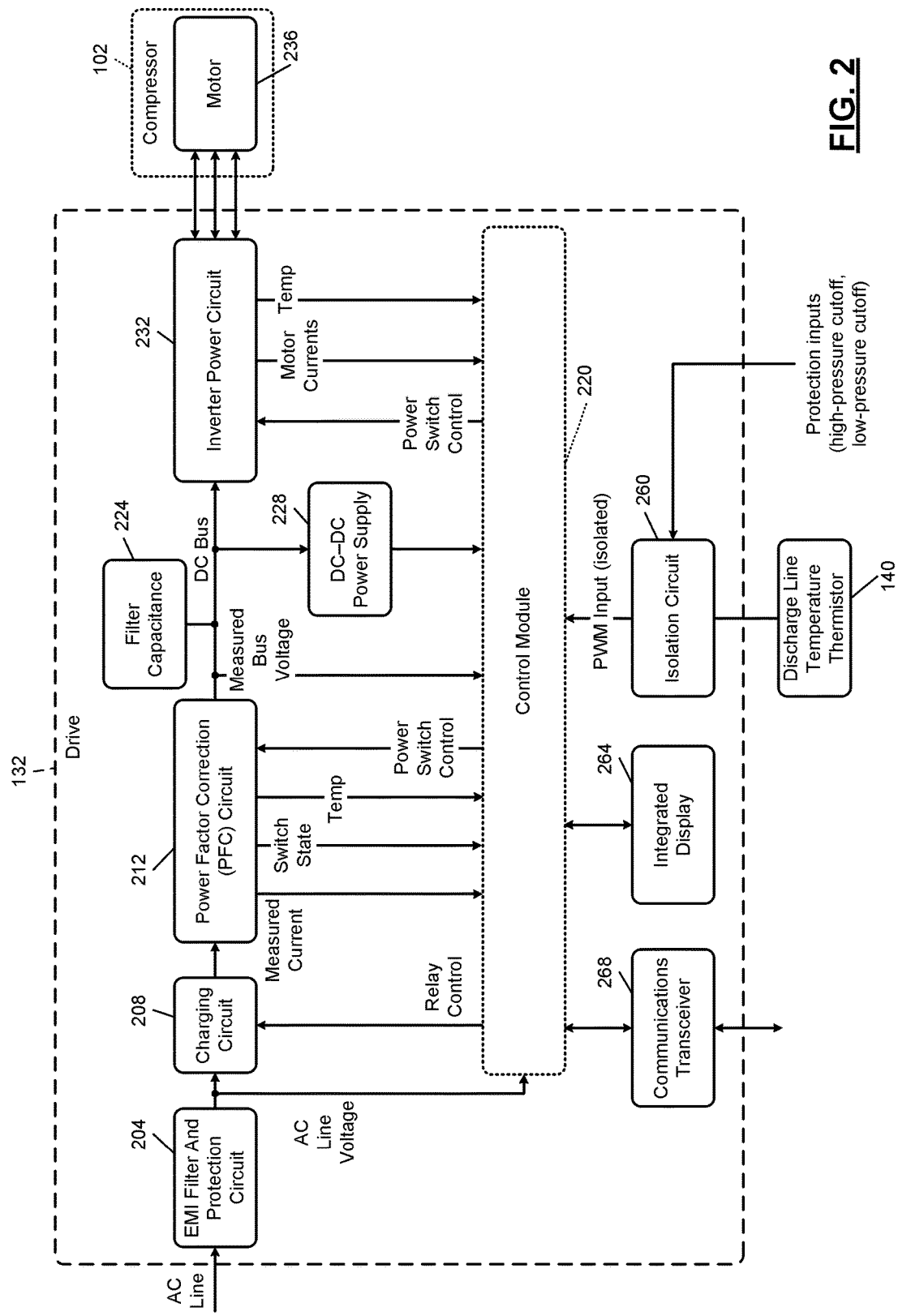
FIG. 2 is a block diagram of an example implementation of the compressor motor drive of FIG. 1.

In FIG. 2, an example implementation of the drive 132 includes an electromagnetic interference (EMI) filter and protection circuit 204, which receives power from an AC line. The EMI filter and protection circuit 204 reduces EMI that might otherwise be injected back onto the AC line from the drive 132. The EMI filter and protection circuit 204 may also remove or reduce EMI arriving from the AC line. Further, the EMI filter and protection circuit 204 protects against power surges, such as may be caused by lightening, and/or other other types of power surges and sags.

A charging circuit 208 controls power supplied from the EMI filter and protection circuit 204 to a power factor correction (PFC) circuit 212. For example, when the drive 132 initially powers up, the charging circuit 208 may place a resistance in series between the EMI filter and protection circuit 204 and the PFC circuit 212 to reduce the amount of current inrush. These current or power spikes may cause various components to prematurely fail.

After initial charging is completed, the charging circuit 208 may close a relay that bypasses the current-limiting resistor. For example, a control module 220 may provide a relay control signal to the relay within the charging circuit 208. In various implementations, the control module 220 may assert the relay control signal to bypass the current-limiting resistor after a predetermined period of time following start up, or based on closed loop feedback indicating that charging is near completion.

The PFC circuit 212 converts incoming AC power to DC power. The PFC circuit 212 may not be limited to PFC functionality—for example, the PFC circuit 212 may also perform voltage conversion functions, such as acting as a boost circuit and/or a buck circuit. In some implementations, the PFC circuit 212 may be replaced by a non-PFC voltage converter. The DC power may have voltage ripples, which are reduced by filter capacitance 224. Filter capacitance 224 may include one or more capacitors arranged in parallel and connected to the DC bus. The PFC circuit 212 may attempt to draw current from the AC line in a sinusoidal pattern that matches the sinusoidal pattern of the incoming voltage. As the sinusoids align, the power factor approaches one, which represents the greatest efficiency and the least demanding load on the AC line.

The PFC circuit 212 includes one or more switches that are controlled by the control module 220 using one or more signals labeled as power switch control. The control module 220 determines the power switch control signals based on a measured voltage of the DC bus, measured current in the PFC circuit 212, AC line voltages, temperature or temperatures of the PFC circuit 212, and the measured state of a power switch in the PFC circuit 212. While the example of use of measured values is provided, the control module 220 may determine the power switch control signals based on an estimated voltage of the DC bus, estimated current in the PFC circuit 212, estimated AC line voltages, estimated temperature or temperatures of the PFC circuit 212, and/or the estimated or expected state of a power switch in the PFC circuit 212. In various implementations, the AC line voltages are measured or estimated subsequent to the EMI filter and protection circuit 204 but prior to the charging circuit 208.

The control module 220 is powered by a DC-DC power supply 228, which provides a voltage suitable for logic of the control module 220, such as 3.3 Volts, 2.5 Volts, etc. The DC-DC power supply 228 may also provide DC power for operating switches of the PFC circuit 212 and an inverter power circuit 232. For example only, this voltage may be a higher voltage than for digital logic, with 15 Volts being one example.

The inverter power circuit 232 also receives power switch control signals from the control module 220. In response to the power switch control signals, switches within the inverter power circuit 232 cause current to flow in respective windings of a motor 236 of the compressor 102. The control module 220 may receive a measurement or estimate of motor current for each winding of the motor 236 or each leg of the inverter power circuit 232. The control module 220 may also receive a temperature indication from the inverter power circuit 232.

For example only, the temperature received from the inverter power circuit 232 and the temperature received from the PFC circuit 212 are used only for fault purposes. In other words, once the temperature exceeds a predetermined threshold, a fault is declared and the drive 132 is either powered down or operated at a reduced capacity. For example, the drive 132 may be operated at a reduced capacity and if the temperature does not decrease at a predetermined rate, the drive 132 transitions to a shutdown state.

The control module 220 may also receive an indication of the discharge line temperature from the compressor 102 using the thermistor 140. An isolation circuit 260 may provide a pulse-width-modulated representation of the resistance of the thermistor 140 to the control module 220. The isolation circuit 260 may include galvanic isolation so that there is no electrical connection between the thermistor 140 and the control module 220.

The isolation circuit 260 may further receive protection inputs indicating faults, such as a high-pressure cutoff or a low-pressure cutoff, where pressure refers to refrigerant pressure. If any of the protection inputs indicate a fault and, in some implementations, if any of the protection inputs become disconnected from the isolation circuit 260, the isolation circuit 260 ceases sending the PWM temperature signal to the control module 220. Therefore, the control module 220 may infer that a protection input has been received from an absence of the PWM signal. The control module 220 may, in response, shut down the drive 132.

The control module 220 controls an integrated display 264, which may include a grid of LEDs and/or a single LED package, which may be a tri-color LED. The control module 220 can provide status information, such as firmware versions, as well as error information using the integrated display 264. The control module 220 communicates with external devices, such as the system controller 130 in FIG. 1, using a communications transceiver 268. For example only, the communications transceiver 268 may conform to the RS-485 or RS-232 serial bus standards or to the Controller Area Network (CAN) bus standard.

PFC Circuits

Figure 3A:
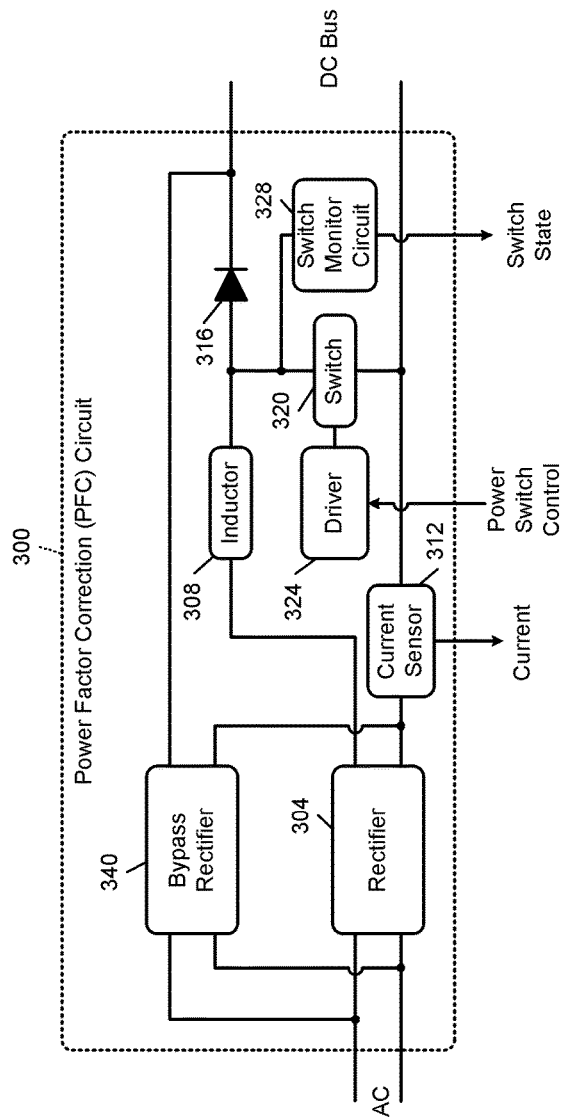
FIG. 3A is a block diagram of an example implementation of the power factor correction (PFC) circuit of FIG. 2.

In FIG. 3A, a PFC circuit 300 is one implementation of the PFC circuit 212 of FIG. 2. The PFC circuit 300 includes a rectifier 304 that converts incoming AC into pulsating DC. In various implementations, the rectifier 304 includes a full-wave diode bridge. The DC output of the rectifier 304 is across first and second terminals. The first terminal is connected to an inductor 308, while the second terminal is connected to a current sensor 312. An opposite end of the inductor 308 is connected to a node that is common to the inductor 308, an anode of a diode 316, and a first terminal of a switch 320.

The PFC circuit 300 generates a DC bus, where a first terminal of the DC bus is connected to a cathode of the diode 316 while a second terminal of the DC bus is connected to the second output terminal of the rectifier 304 via the current sensor 312. The current sensor 312 can, therefore, sense the current within the switch 320 as well as the current in the DC bus and current in the inductor 308. The second terminal of the DC bus is also connected to a second terminal of the switch 320.

A driver 324 receives the power switch control signal from the control module 220 of FIG. 2 and rapidly charges or discharges a control terminal of the switch 320. For example, the switch 320 may be a field effect transistor with a gate terminal as the control terminal. More specifically, the switch 320 may be a power metal-oxide-semiconductor field-effect transistor (MOSFET), such as the STW38N65M5 power MOSFET from STMicroelectronics. The driver 324, in response to the power switch control signal, charges or discharges the capacitance at the gate of the field effect transistor.

A switch monitor circuit 328 measures whether the switch is on or off. This closed loop control enables the control module 220 to determine whether the switch 320 has reacted to a command provided by the power switch control signal and may also be used to determine how long it takes the switch 320 to respond to that control signal. The measured switch state is output from the switch monitor circuit 328 back to the control module 220. The control module 220 may update its control of the power switch control signal to compensate for delays in turning on and/or turning off the switch 320.

In FIG. 3A, the inductor, the switch 320, and the diode 316 are arranged in a boost configuration. In brief, the switch 320 closes, causing current through the inductor 308 to increase. Then the switch 320 is opened, but the current through the inductor 308 cannot change instantaneously because the voltage across an inductor is proportional to the derivative of the current. The voltage across the inductor 308 becomes negative, meaning that the end of the inductor 308 connected to the anode of the diode 316 experiences a voltage increase above the voltage output from the rectifier 304.

Once the voltage at the anode of the diode 316 increases above the turn-on voltage of the diode 316, the current through the inductor 308 can be fed through the diode 316 to the DC bus. The current through the inductor 308 decreases and then the switch 320 is closed once more, causing the current and the inductor 308 to increase.

In various implementations, the switch 320 may be turned on until the current sensor 312 determines that a predetermined threshold of current has been exceeded. At that time, the switch 320 is turned off for a specified period of time. This specified period may be adaptive, changing along with the voltage of the DC bus as well as the voltage of the AC input change. However, the off time (when the switch 320 is open) is a specified value. Once a time equal to the specified value has elapsed, the switch 320 is turned back on again and the process repeats. The off time can be fixed or variable. In the case of the off time being variable, the off time can be limited to at least a predetermined minimum off time.

To reduce the physical size and parts cost of the PFC circuit 300, the inductance of the inductor 308 (which may be the largest contributor to the physical size of the PFC circuit 300) may be lowered. However, with a lower inductance, the inductor 308 will saturate more quickly. Therefore, the switch 320 will have to operate more quickly. While more quickly and smaller are relative terms, present power switching control operates in the range of 10 kilohertz to 20 kilohertz switching frequencies. In the present application, the switching frequency of the switch 320 may be increased to more than 50 kilohertz, more than 100 kilohertz, or more than 200 kilohertz. For example, the switching frequency of the switch may be controlled to be approximately 200 kilohertz.

The switch 320 is therefore chosen to allow for faster switching as well as to have low switching losses. With faster switching, the inductance of the inductor 308 can be smaller. In addition, the diode 316 may need to be faster. Silicon carbide diodes may have fast response times. For example, the diode 316 may be an STPSC2006CW Silicon Carbide dual diode package from STMicroelectronics.

In order to accurately drive the switch 320 when operating at higher speeds, the control strategy must similarly be accelerated. For example only, the control module 220 may include multiple devices, such as a microcontroller configured to perform more involved calculations and an FPGA (field programmable gate array) or PLD (programmable logic device) configured to monitor and respond to inputs in near real time. In this context, near real time means that the time resolution of measurement and time delay in responding to inputs of the FPGA or PLD is negligible compared to the physical time scale of interest. For faster switching speeds, the near real time response of the FPGA/PLD may introduce non-negligible delays. In such cases, the delay of the FPGA/PLD and driving circuitry may be measured and compensated for. For example, if the turn-off of a switch occurs later than needed because of a delay, the turn-off can be instructed earlier to compensate for the delay.

A bypass rectifier 340 is connected in parallel with the rectifier 304 at the AC line input. A second output terminal of the bypass rectifier 340 is connected to the second terminal rectifier 304. However, a first output terminal of the bypass rectifier 340 is connected to the cathode of the diode 316.

As a result, when the PFC circuit 300 is not operating to boost the DC bus voltage, the bypass rectifier 340 will be active when the line-to-line voltage of the AC input exceeds the voltage across the DC bus. The bypass rectifier 340, in these situations, diverts current from passing through the diode 316. Because the inductor 308 is small, and the switch 320 switches rapidly, the diode 316 is also selected to exhibit fast switching times. The diode 316 may, therefore, be less tolerant to high currents, and so current is selectively shunted around the diode 316 by the bypass rectifier 340.

In addition, the current path through the rectifier 304 and the diode 316 experiences three diode voltage drops or two diode voltage drops and the switch voltage drop, while the path through the bypass rectifier 340 experiences only two diode voltage drops. While the single phase AC input in FIG. 3A is associated with a boost converter topology, the present disclosure also encompasses a buck converter topology or a buck-boost converter topology.

Figure 3B:
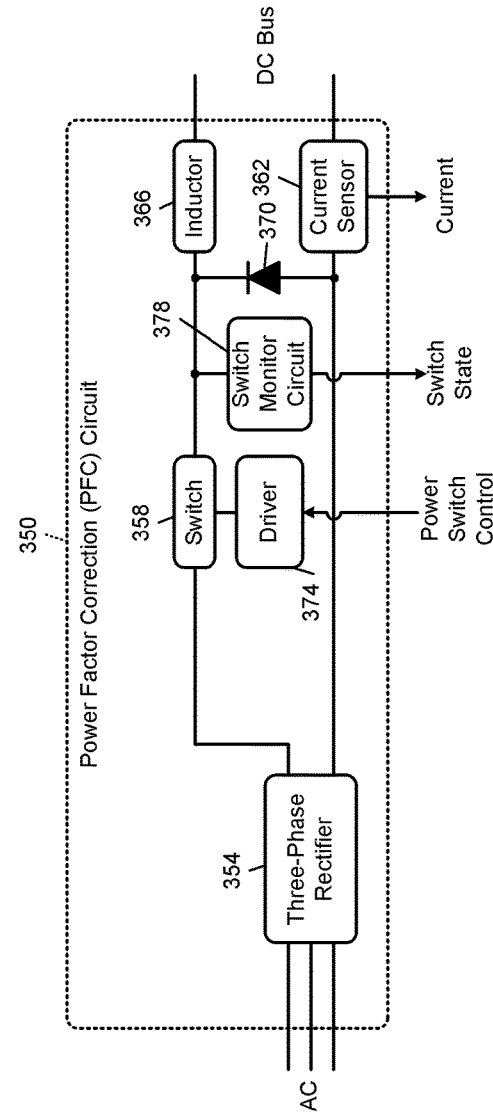
FIG. 3B is a block diagram of another example implementation of the PFC circuit of FIG. 2.

In FIG. 3B, a buck converter topology is shown with a three-phase AC input signal. Note that the principles of the present disclosure also apply to a boost converter or buck-boost converter topology used with a three-phase AC input. A PFC circuit 350 represents another implementation of the PFC circuit 212 of FIG. 2.

A three-phase rectifier 354 receives three-phase AC and generates pulsating DC across first and second terminals. A switch 358 is connected between the first terminal of the three-phase rectifier 354 and a common node. The common node is connected to an inductor 366 and a cathode of a power diode 370.

An anode of the power diode 370 is connected to a second terminal of the three-phase rectifier 354. An opposite terminal of the inductor 366 establishes one terminal of the DC bus, while the second output of the three-phase rectifier 354 establishes the other terminal of the DC bus. In the configuration shown in FIG. 3B, the switch 358, the inductor 366, and the diode 370 are configured in a buck topology.

A current sensor 362 is connected in series between the anode of the diode 370 and the DC bus. In other implementations, the current sensor 362 may be located in series with the inductor 366. In other implementations, the current sensor 362 may be located in series with the switch 358. In other implementations, the current sensor 362 may be located in series between the anode of the diode 370 and the second output of the three-phase rectifier 354. The current sensor 362 measures current through the inductor 366 as well as current through the DC bus and provides a current signal indicative of the amount of the current.

A driver 374 drives a control terminal of the switch 358 based on a power switch control signal from the control module 220 in FIG. 2. A switch monitor circuit 378 detects whether the switch 358 has opened or closed and reports the switch state to the control module 220. With the location of the current sensor 362, the current sensor 362 will measure approximately zero current when the switch 358 is open. The switch monitoring circuits 328 and 378 provide accurate information regarding timing of the actual switching and protect the switches (320 and 358) from possible damage, such as from too high of current and/or sustained oscillation between open and closed states.

The driver 324 is a high frequency switching driver that operates the switch 320 to control charging and discharging of the inductor 308. Based on signals from the control module 220, the driver 324 alternately controls the switch 320 between a closed state and an open state. The inductor 308 charges when the switch 320 is in the closed state, and the inductor 308 discharges when the switch 320 is in the open state. While the example of the gate driver is shown and will be discussed, the following may also be applicable to drivers of other types of switches including switches that have a gate terminal and switches that do not have a gate terminal.

As discussed further below, the control module 220 generates the signals to maintain the switch 320 in the closed state until the current through the inductor 308 becomes greater than a predetermined current, such as a demanded current through the inductor 308. When the current through the inductor 308 becomes greater than the predetermined current, the control module 220 generates the signals to transition the switch 320 to the open state. The control module 220 then generates the signals to maintain the switch 320 in the open state for a predetermined period, such as a desired OFF period of the switch, before generating the signals to transition the switch 320 to the closed state.

Generally speaking, the components of the PFC circuit 212 (e.g., the driver 324 or 374, the switch control circuit, the clamp circuit, the damping circuit, and the one or more ferrite beads) are selected and designed to minimize turn ON and turn OFF delays of the switch (e.g., the switch 320 or 358) and minimize unintended oscillation of the switch between the open and closed states.

Figure 4:
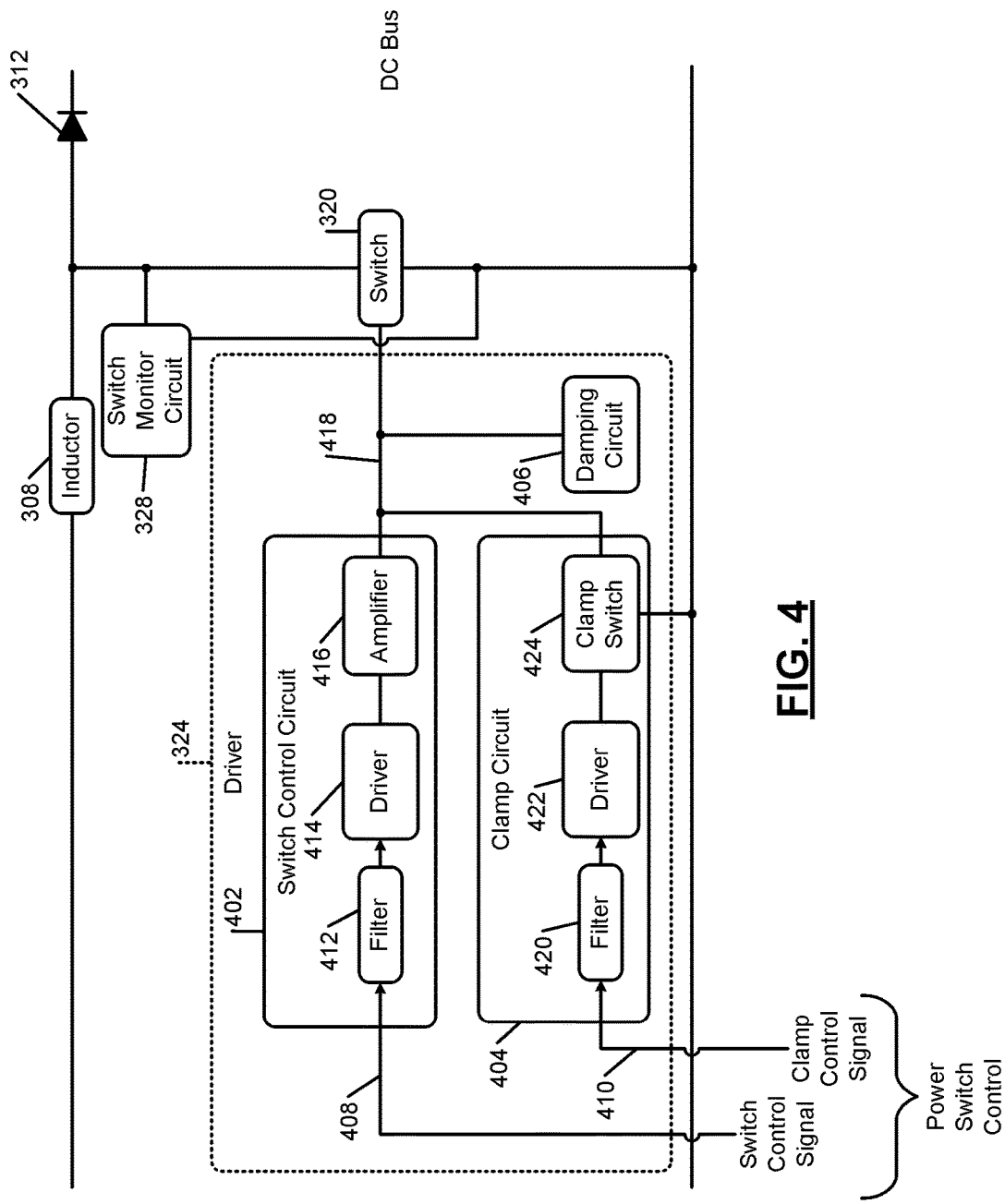
FIG. 4 is a functional block diagram of an example implementation of the gate driver of the PFC circuit of FIG. 2.

With reference to FIG. 4, an example implementation of the driver 324 and the switch 320 is presented. The switch 320 can be switched between the open and closed states at greater than a predetermined frequency. This enables the inductor 308 to be smaller and less costly than if the switch 320 could only be switched at lower frequencies. An example of the switch 320 is switch part number STW38N65M5 MOSFET or a variant thereof, manufactured by STMicroelectronics. The predetermined frequency may be 50 Kilohertz (KHz), greater than 50 KHz, greater than 75 KHz, greater than 100 KHz, greater than 125 KHz, greater than 150 KHz, greater than 175 KHz, or greater than 200 KHz.

Figure 5A:
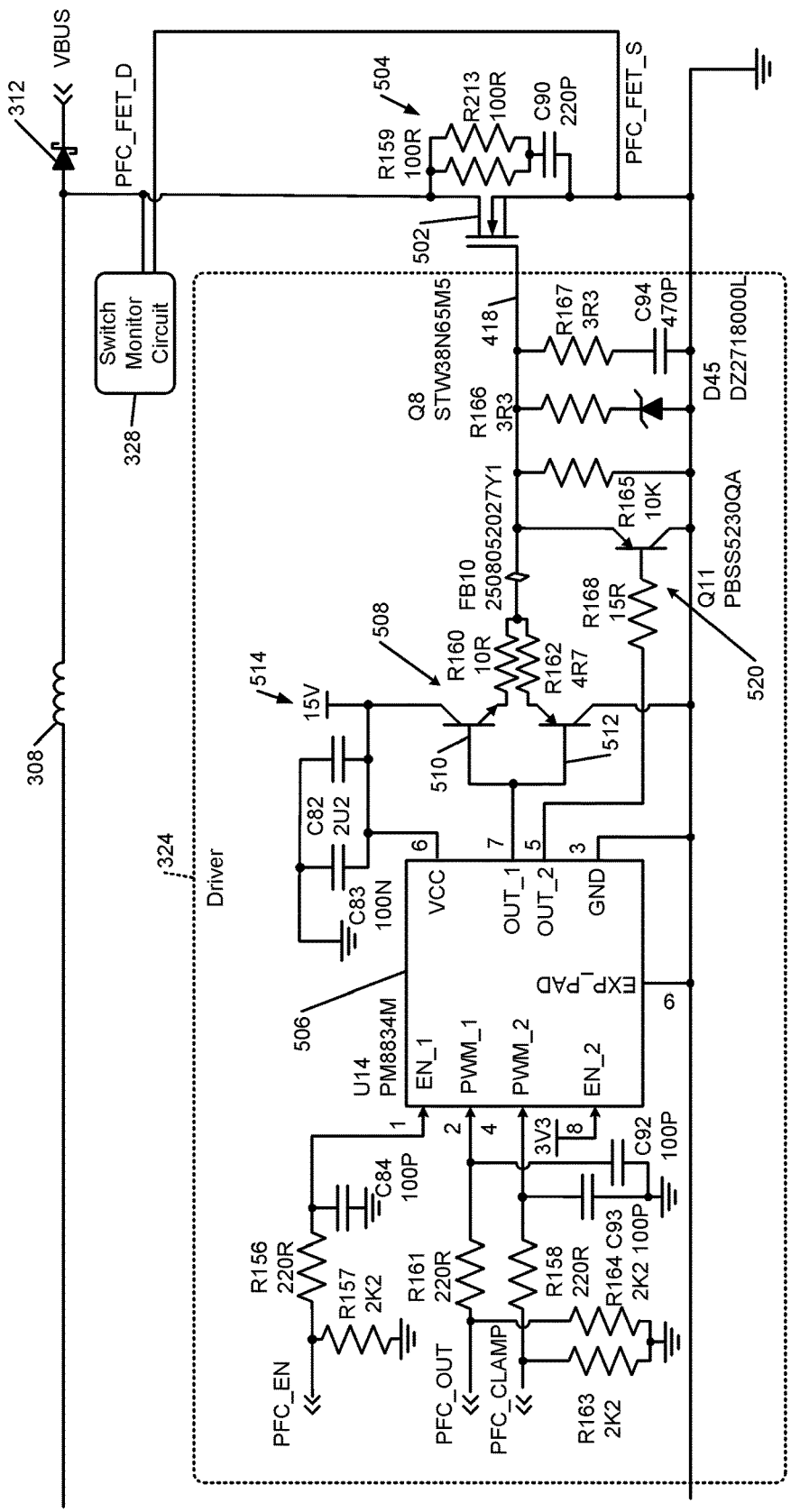
FIGS. 5A and 5B are circuit diagrams of example implementations of the gate driver of the PFC circuit of FIG. 2.
Figure 5B:
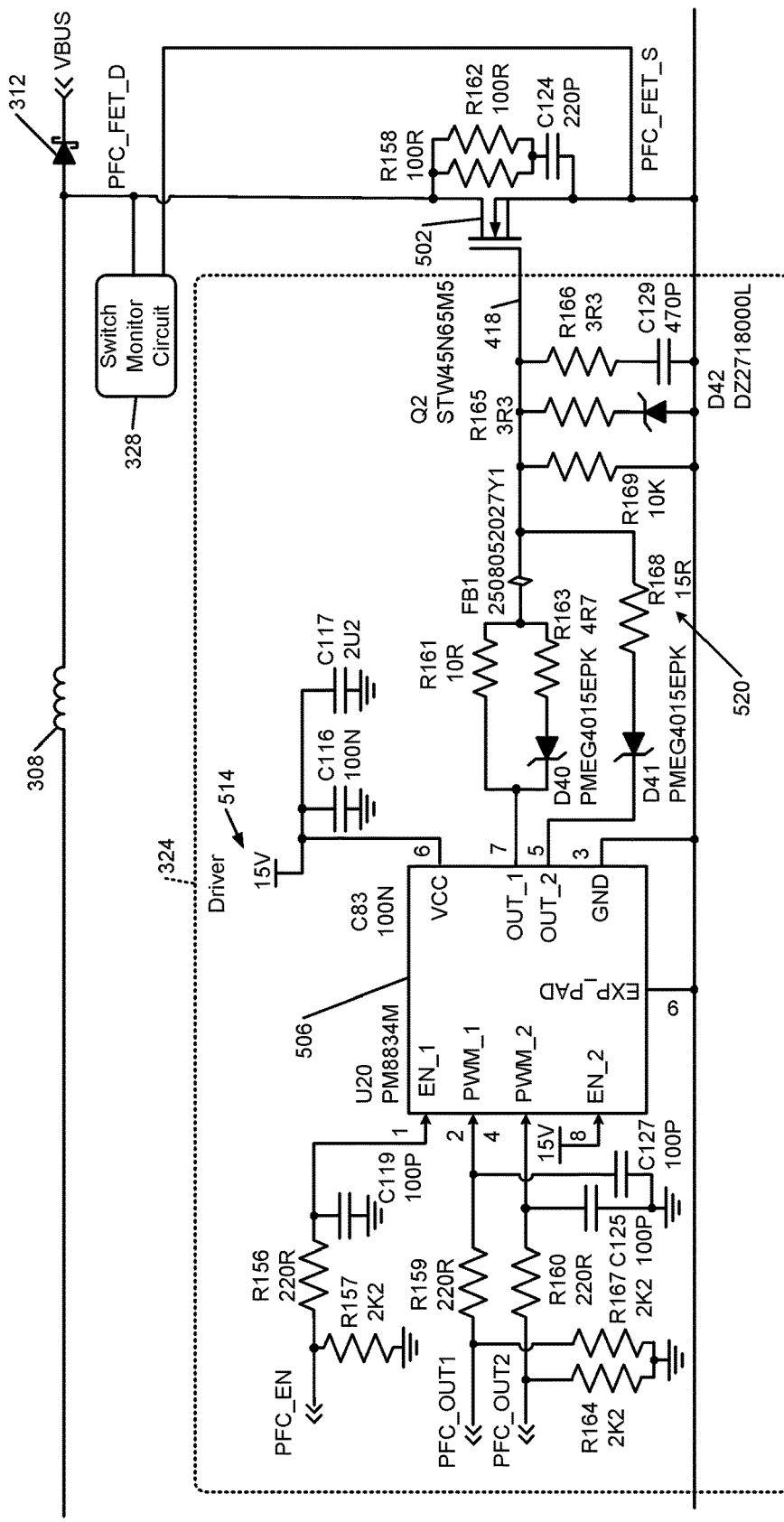

The driver 324 includes a switch control circuit 402, a clamp circuit 404, and a damping circuit 406. The switch control circuit 402 selectively transitions the switch 320 between the open and closed states based on or at the predetermined frequency, based on or to maintain inductor current at a predetermined maximum current, or based on or to maintain inductor current within a predetermined current range. In the example of transitioning the switch 320 between the open and closed states based on or at the predetermined frequency, an average or instantaneous frequency of transitioning the switch 320 between the open and closed states may be controlled based on or at the predetermined frequency. For example, the switch control circuit 402 may control switching of the switch 320 using peak mode control with a variable desired OFF period, such as described in commonly assigned U.S. application Ser. No. 15/419,423, filed on Jan. 30, 2017, titled "Switch Off Time Control Systems And Methods" which claims the benefit of U.S. Prov. App. No. 62/323,538, filed on Apr. 15, 2016, the disclosures of which are incorporated in their entireties. The damping circuit 406 may also include a series element, such as a gate resistor and/or a ferrite bead, such as shown in the examples of FIGS. 5A and 5B.

The clamp circuit 404 is a protection circuit that couples a control terminal of the switch 320 to ground when the switch 320 is to be in the open state. The damping circuit 406 is provided to minimize or prevent oscillation of the switch 320 between the open state and the closed state. The clamp circuit 404 and/or the damping circuit 406 may be omitted in various implementations.

The switch control circuit 402 and the clamp circuit 404 control the switch 320 based on the signals from the control module 220. The signals from the control module 220 may include a switch control signal 408 that is provided to the switch control circuit 402 and a clamp control signal 410 that is provided to the clamp circuit 404. The switch control signal 408 and the clamp control signal 410 may be, for example, pulse width modulation (PWM) signals. As discussed above, the switch control signal 408 and/or the clamp control signal 410 may be set based on peak mode control where the switching frequency may vary.

The switch control circuit 402 may include a filter 412, a driver 414, and an amplifier 416. The filter 412 filters the switch control signal 408 to remove noise from the switch control signal 408. The driver 414 generates a control signal according to the switch control signal 408. The amplifier 416 amplifies the control signal and applies a resulting voltage (via a low impedance) to the control terminal of the switch 320 via line 418. In various implementations, the amplifier 416 may be omitted.

The control module 220 may set the switch control signal 408 to a first state (e.g., 1) to operate the switch 320 in the closed state. The control module 220 may set the switch control signal 408 to a second state (e.g., 0) to operate the switch 320 in the open state. Based on the switch control signal 408 being in the first state, the amplifier 416 applies a voltage (e.g., 15 V) to the control terminal of the switch 320 to operate the switch 320 in the closed state. Based on the switch control signal 408 being in the second state, the amplifier 416 connects the control terminal of the switch 320 to ground to operate the switch 320 in the open state.

The clamp circuit 404 includes a filter 420 and a driver 422. The filter 420 filters the clamp control signal 410 to remove noise from the clamp control signal 410. According to the clamp control signal 410, the driver 422 controls the state of a clamp switch 424. The clamp switch 424 is coupled between the control terminal of the switch 320 and ground.

The control module 220 may set the clamp control signal 410 to a first state (e.g., 1) to operate the clamp switch 424 in the open state. The control module 220 may set the clamp control signal 410 to a second state (e.g., 0) to operate the clamp switch 424 in the closed state. Based on the clamp control signal 410 being in the first state, the driver 422 operates the clamp switch 424 in the open state. Based on the clamp control signal 410 being in the second state, the driver 422 operates the clamp switch 424 in the closed state. When the clamp switch 424 is in the closed state, the clamp switch 424 connects the control terminal of the switch 320 to ground.

The clamp switch 424 acts as a secondary control to place the switch 320 in the open state. Generally speaking, the control module 220 generates the switch control signal 408 and the clamp control signal 410 such that the switch 320 and the clamp switch 424 are in opposite states.

For example, at some times, the control module 220 may set the switch control signal 408 to the first state and the clamp control signal 410 to the first state. In this situation, the amplifier 416 connects the control terminal of the switch 320 to voltage such that the switch 320 is in the closed state, and the clamp switch 424 serves as an open circuit between the control terminal of the switch 320 and ground.

At other times, the control module 220 may set the switch control signal 408 to the second state and the clamp control signal 410 to the second state. In this situation, the amplifier 416 connects the control terminal of the switch 320 to ground such that the switch 320 is in the open state. The clamp switch 424 also connects the control terminal of the switch 320 to ground to help ensure that the switch 320 is in the open state and/or to help transition the switch 320 to the open state faster.

As stated above, the control module 220 generally generates the switch control signal 408 and the clamp control signal 410 such that the switch 320 and the clamp switch 424 are in opposite states. However, the control module 220 may generate the switch control signal 408 and the clamp control signal 410 to provide dead time during which both the clamp switch 424 and the switch 320 are in the open state at the same time before one of the clamp switch 424 and the switch 320 is transitioned to the closed state.

For example, the control module 220 may transition the switch control signal 408 to the first state a predetermined period after transitioning the clamp control signal 410 to the first state. The control module 220 may also transition the switch control signal 408 to the second state a predetermined period before transitioning the clamp control signal 410 to the second state. As such, both the switch 320 and the clamp switch 424 will be in the open state for some period before one of the switch 320 and the clamp switch 424 is transitioned to the closed state. This prevents the possibility of both the clamp switch 424 and the switch 320 being in the closed state at the same time.

FIG. 5A illustrates an example implementation of the driver 324. As an example, the switch 320 may be an n-type metal-oxide-semiconductor field-effect transistor (MOSFET) 502. A snubber circuit 504 may be connected in parallel with the MOSFET 502. The snubber circuit 504 suppresses rapid rises in voltage across the MOSFET 502 as the MOSFET 502 is being switched between the open and closed states.f5

The gate terminal (i.e., control terminal) of the MOSFET 502 is coupled to the driver 324. The MOSFET 502 should be in the closed state when the voltage is applied to the gate terminal of the MOSFET 502. The MOSFET 502 should be in the open state when the gate terminal of the MOSFET 502 is connected to ground.

The driver 320 may include a dual driver module 506 that includes two drivers that operate as the driver 414 for the switch control circuit 402 and the driver 422 for the clamp circuit 404. The dual driver module 506 includes terminals PWM_1, PWM_2, OUT_1, and OUT_2. The PWM_1 terminal receives the switch control signal 408, which is labeled as "PFC_OUT" in the example of FIG. 5. The PWM_2 terminal receives the clamp control signal 410, which is labeled as "PFC_CLAMP" in the example of FIG. 5.

The PWM_1 and the PWM_2 terminals may be coupled to RC filters to filter noise provided in the switch control signal 408 and clamp control signal 410, respectively. For example, the PWM_1 terminal is coupled to resistors R161 and R164 and capacitor C92, which form an example of the filter 412 of FIG. 4. The PWM_2 terminal is coupled to resistors R158 and R163 and capacitor C93, which form an example of the filter 420 of FIG. 4.

The dual driver module 506 also includes a first enable input terminal, labeled EN_1, and a second enable input terminal, labeled EN_2. When a signal received at the first enable input terminal is in a first state, the dual driver module 506 may maintain the switch 320 in the open state, regardless of the switch control signal 408. When the signal at the first enable input is in a second state, the switch 320 may be switched between the open and closed states based on the state of the switch control signal 408. When a signal received at the second enable input terminal is in a first state, the clamp switch 424 may be maintained in the open state. When the signal at the second enable input is in a second state, the clamp switch 424 may be switched between the open and closed states based on the state of the clamp control signal 410. In various implementations, the signal applied to the second enable input terminal may be maintained in the second state to allow switching of the clamp switch 424.

Push-pull amplifier 508 is an example of the amplifier 416. The dual driver module 506 controls a signal applied to the push-pull amplifier 508 based on the state of the switch control signal 408. The push-pull amplifier 508 may include an NPN-bipolar junction transistor (BJT) 510 and a PNP-BJT 512 configured as emitter followers. While the example of BJTs is provided, another suitable type of switch may be used. Additionally, other configurations are possible with different configurations of P and N type switches.

The push-pull amplifier 508 is coupled to the gate terminal of the MOSFET 502 via the line 418 and connects the gate terminal of the MOSFET 502 to voltage or ground based on the signal from the dual driver module 506 generated based on the switch control signal 408. The OUT_1 terminal may be connected to the base terminal of the NPN-BJT 510 and the base terminal of the PNP-BJT 512. While the example of the OUT_1 terminal being connected to the base terminals of both the NPN-BJT 510 and the PNP-BJT 512 is provided, separate output terminals may be connected to the base terminals of the NPN-BJT 510 and the PNP-BJT 512.

FIG. 5B illustrates another example implementation of the driver 324. As shown in FIG. 5B, the push-pull amplifier 508 may be omitted.

Referring again to FIG. 5A, when the dual driver module 506 outputs a signal in a first state via the OUT_1 terminal, the NPN-BJT 510 connects its collector and emitter terminals to electrically couple the gate terminal of the MOSFET 502 to a reference voltage 514. The reference voltage 514 may be approximately 15 V or another suitable voltage. The connection of the gate terminal of the MOSFET 502 to the reference voltage 514 operates the MOSFET 502 in the closed state. When the dual driver module 506 outputs the signal in the first state via the OUT_1 terminal, the PNP-BJT 512 operates in the open state to disconnect the line 418 from ground.

When the dual driver module 506 outputs the signal in a second state via the OUT_1 terminal, the PNP-BJT 512 connects its collector and emitter terminals to electrically couple the gate terminal of the MOSFET 502 to ground. The connection of the gate terminal of the MOSFET 502 to ground operates the MOSFET 502 in the open state. When the dual driver module 506 outputs the signal in the second state via the OUT_1 terminal, the NPN-BJT 510 operates in the open state to disconnect the reference voltage 514 from the line 418.

The dual driver module 506 outputs a signal corresponding to the clamp control signal 410 from the OUT_2 terminal. A PNP-BJT 520 is an example of the clamp switch 424. The OUT_2 terminal of the dual driver module 506 is coupled to the PNP-BJT 520 via a resistor R168. The PNP-BJT 520 connects and disconnects the gate terminal of the MOSFET 502 to and from ground based on the signal from the dual driver module 506 output via the OUT_2 terminal. For example, the PNP-BJT 520 may connect the gate terminal of the MOSFET 502 with ground when the signal from the dual driver module 506 is in a first state (e.g., 15 V). The PNP-BJT 520 may create an open circuit and disconnect the gate terminal of the MOSFET 502 from ground when the signal from the dual driver module 506 is in a second state (e.g., ground or negative voltage). While the example of the PNP-BJT 520 is provided as an example of the clamp switch 424, the clamp switch 424 could be a PNP FET. In this example, the base-emitter junction reverse bias rating would be greater than the applied gate voltage (e.g., 15 V).

An example of the damping circuit 406 includes a ferrite bead FB10, a resistor R166, a Zener diode D45, a resistor R167, and a capacitor C94. The damping circuit 406 may, however, include different and/or another suitable arrangement of components.

In summary, the driver 324 controls charging and discharging of the inductor 308 by opening and closing the switch 320. To prevent oscillation of the switch 320, the driver 320 may include a damping circuit that absorbs access energy caused by high frequency switching of the switch 320. The driver 320 may also include a clamp circuit that clamps the switch 320 to ground to operate the switch 320 in the open state when the switch 320 is to be in the open state. While the example of connecting and clamping the control terminal of the switch 320 to ground to operate the switch 320 in the open state is provided, the present application is also applicable to other implementations using other reference potentials to operate the switch 320 in the open and closed states. For example, in the example of FIG. 3B, the control terminal of the switch 358 may be connected to ground to operate the switch 358 in the closed state and may be connected and clamped to a positive or negative voltage (e.g., −4 V to −7 V) to operate the switch 358 in the open state.

Figure 6:
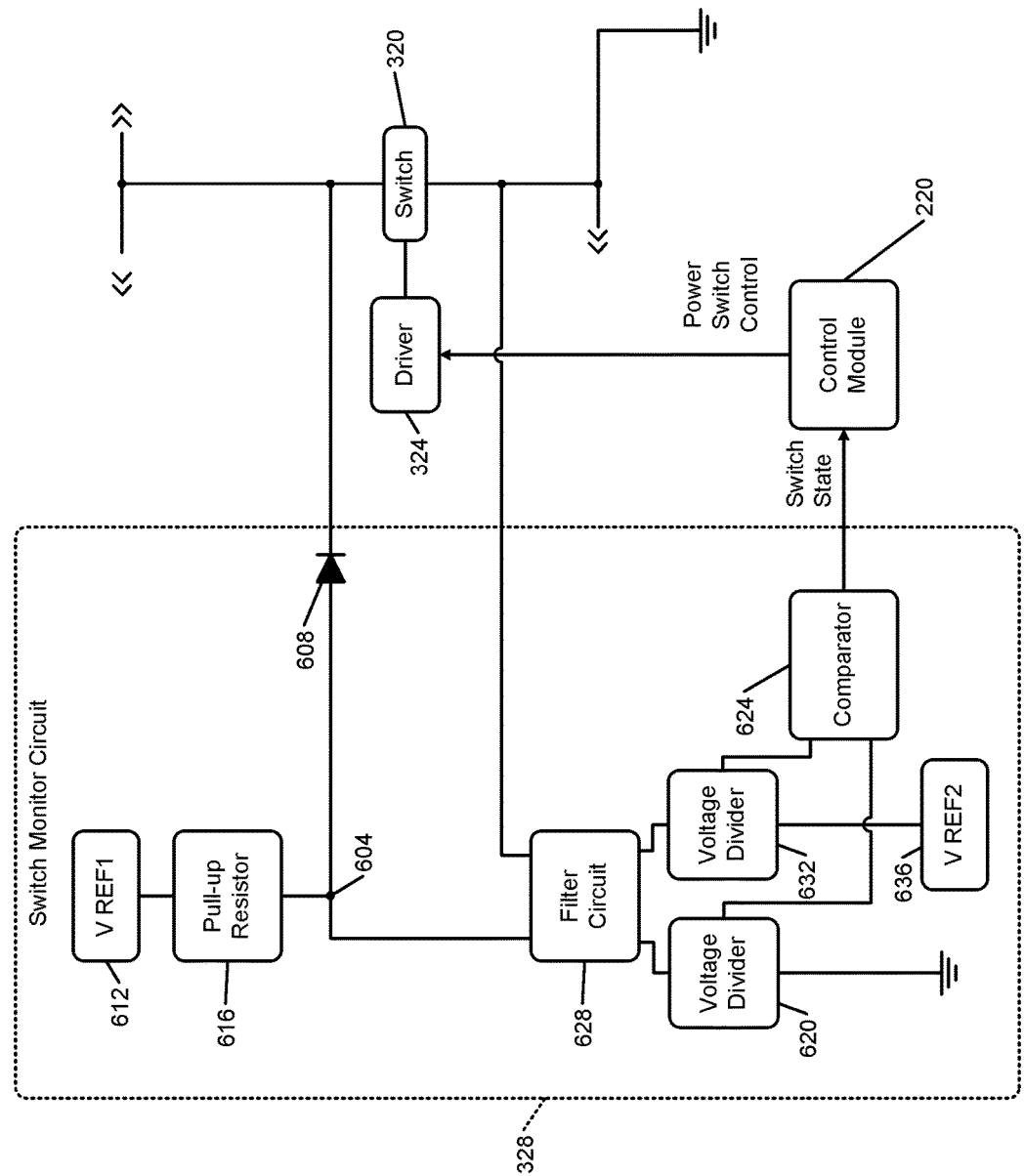
FIG. 6 is a functional block diagram of an example implementation of the switch monitor circuit of the power factor correction circuit.
Figure 7:
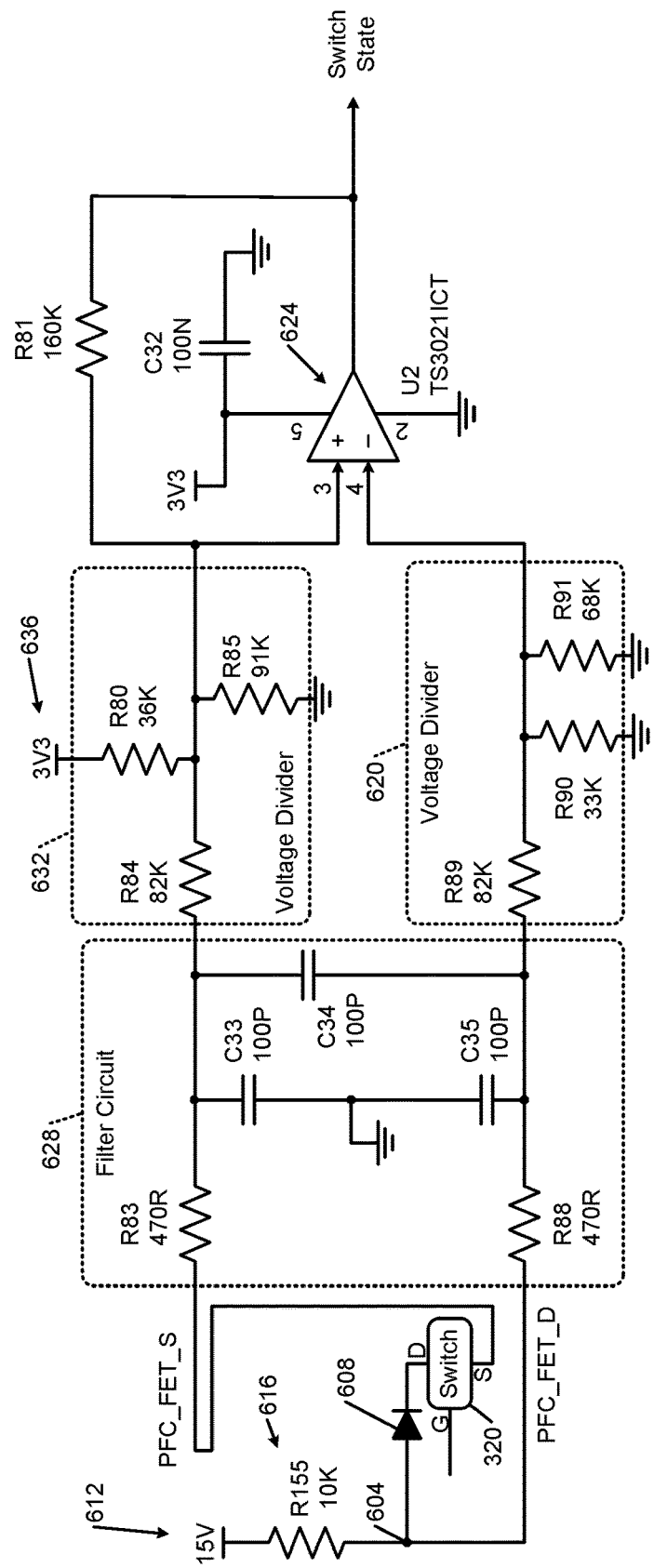
FIG. 7 is a circuit diagram of an example implementation of the switch monitor circuit of the power factor correction circuit.

FIG. 6 is a functional block diagram of an example implementation of a switch monitor circuit, such as the switch monitor circuit 328 of FIG. 3A. FIG. 7 is a circuit diagram of an example implementation of a switch monitor circuit, such as the switch monitor circuit 328 of FIG. 3A.

As shown in FIGS. 6 and 7, a node 604 is connected to a first terminal (e.g., drain (D) terminal or collector terminal) of the switch 320. A diode 608 may be implemented between the node 604 and the first terminal of the switch 320. The node 604 is also connected to a first reference voltage (V REF1) 612 via a pull-up resistor 616. For example only, the first reference voltage 612 may be approximately 15 V or another suitable voltage.

A first voltage divider 620 divides a voltage at the node 604 and, as a result of the division, outputs a first voltage to a comparator 624. A combination of resistors providing an example implementation of the first voltage divider 620 is provided in FIG. 7. A filter circuit 628 may be implemented to filter the voltage at the node 604 and input a filtered voltage to the first voltage divider 620.

A second voltage divider 632 divides a voltage at a second terminal (e.g., source (S) terminal or emitter terminal) of the switch 320 and, as a result of this division, outputs a second voltage to the comparator 624. A combination of resistors providing an example implementation of the second voltage divider 632 is provided in FIG. 7. The filter circuit 628 may also filter the voltage at the second terminal of the switch 320 and input a filtered voltage to the second voltage divider 632. A combination of resistors and capacitors providing an example implementation of the filter circuit 628 is also provided in FIG. 7.

The second terminal of the switch 320 is connected to ground. Ground may refer to a reference ground potential or an actual ground potential. To prevent ground bounce, the voltage at the second terminal of the switch 320 or at a location closer to the second terminal of the switch 320 may be used instead of ground for the second voltage input to the comparator 624 and, more specifically, the filter circuit 628.

The first voltage input to the comparator 624 serves as a threshold indicative of whether the switch 320 is in the closed state or the open state when compared with the second voltage input to the comparator 624. For example only, the first voltage divider 620 may output the first voltage to the comparator 624 at approximately 2 V to approximately 3 V or one or more other suitable voltages.

The second voltage input to the comparator 624 varies based on whether the switch 320 is in the closed state or the open state. For example only, when the switch 320 is in the closed state, the second voltage divider 632 may decrease the second voltage input to the comparator 624 to less than the first voltage input to the comparator 624. The first voltage divider 620 may decrease the first voltage input to the comparator 624 when the switch 320 is in the closed state, for example, to provide hysteresis. The first voltage divider 620 may decrease the first voltage, for example, to a lower voltage between 2 V and 3 V.

When the switch 320 is in the open state, the second voltage divider 632 may increase the second voltage input to the comparator 624 to greater than the first voltage input to the comparator 624. The first voltage divider 620 may increase the first voltage input to the comparator 624 when the switch 320 is in the open state, for example, to provide hysteresis. The first voltage divider 620 may increase the first voltage, for example, to a higher voltage between 2 V and 3 V. The higher voltage is greater than the lower voltage.

Whether the first voltage input to the comparator 624 is greater than or less than the second voltage input to the comparator 624 therefore indicates whether the switch 320 is in the closed state or in the open state.

The comparator 624 generates the switch state signal based on a comparison of the first and second voltages output by the first and second voltage dividers 620 and 632, respectively. The switch state signal indicates whether the switch 320 is in the open state or the closed state. For example, the comparator 624 may set the switch state signal to a first state when the first voltage output by the first voltage divider 620 is greater than the second voltage output by the second voltage divider 632. The switch state signal being in the first state may therefore indicate that the switch 320 is in the open state. The comparator 624 may set the switch state signal to a second state when the first voltage output by the first voltage divider 620 is less than the second voltage output by the second voltage divider 632. The switch state signal being in the second state may therefore indicate that the switch 320 is in the closed state.

While the example of a single threshold (first voltage) has been discussed, multiple thresholds may be compared with the second voltage output by the second voltage divider 632. For example, the comparator 624 may set the switch state signal to the first state when the second voltage output by the second voltage divider 632 is greater than, for example, a first threshold voltage. The comparator 624 may set the switch state signal to the second state when the second voltage output by the second voltage divider 632 is less than a second threshold voltage that is less than the first threshold voltage. This example is similar to the first voltage divider 620 varying the first voltage from the lower voltage to the higher voltage and vice versa, but involves the use of two different voltage dividers.

As discussed further below, the control module 220 controls switching of the switch 320 based on the switch state signal. For example, the control module 220 determines a turn OFF delay period of the switch 320 and a turn ON delay period of the switch 320 based on the switch state signal. The turn OFF delay period corresponds to a period between when the control module 220 outputs a signal to transition the switch 320 to the open state and when the switch 320 reaches the open state, as indicated by the switch state signal. The turn ON delay period corresponds to a period between when the control module 220 outputs a signal to transition the switch 320 to the closed state and when the switch 320 reaches the closed state, as indicated by the switch state signal. The control module 220 may control switching timing of the switch 320 based on the turn ON and turn OFF delay periods.

Figure 8:
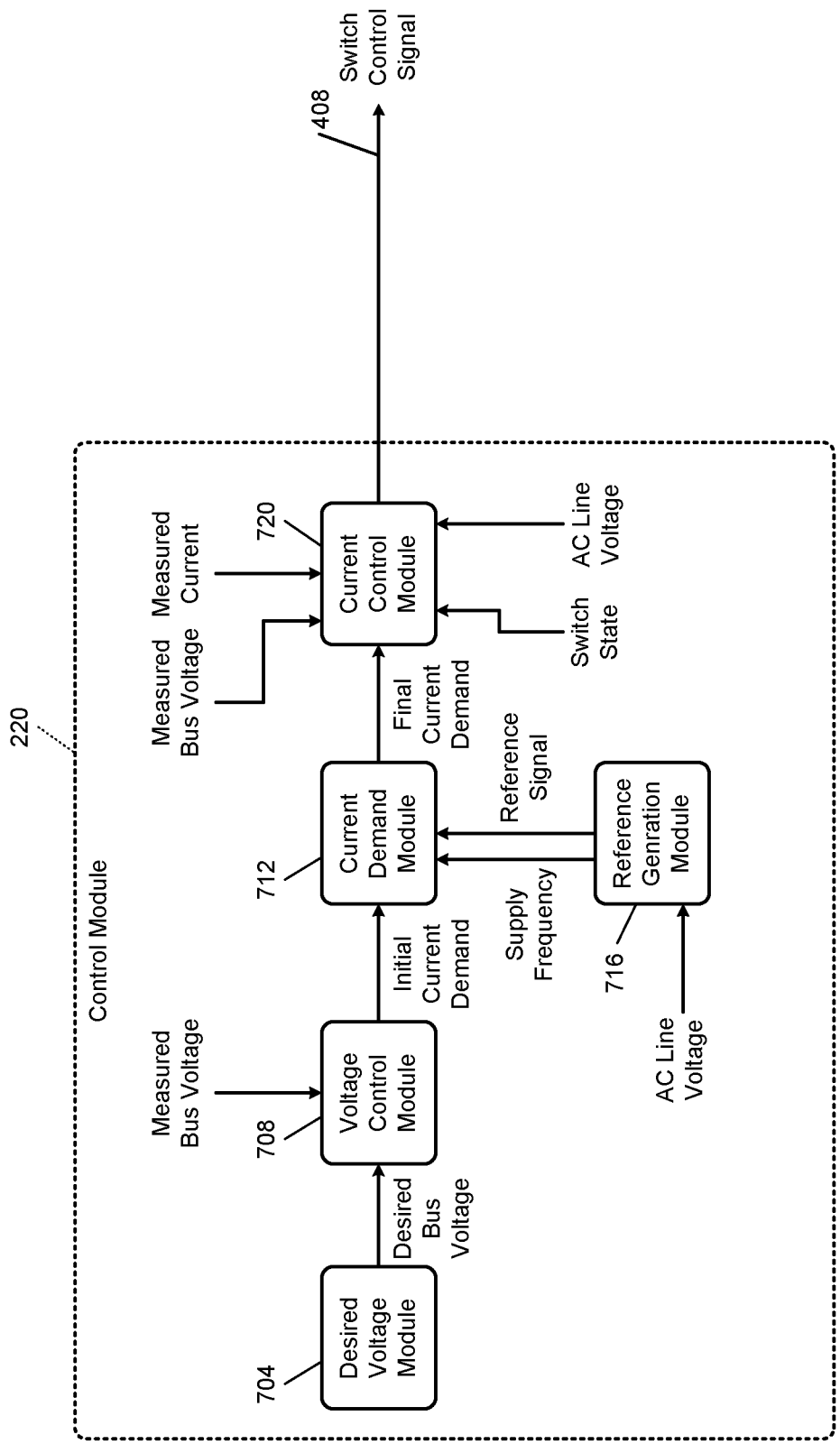
FIG. 8 is a functional block diagram of an example implementation of the control module.

FIG. 8 is a functional block diagram of the control module 220. A desired voltage module 704 determines a desired DC bus voltage. The desired DC bus voltage may be a fixed predetermined value or may be variable. The desired voltage module 704 may determine the desired DC bus voltage, for example, based on a peak voltage of the AC line ($V_{PEAK}$) and/or at least one of a plurality of system parameters.

For example only, the plurality of system parameters may include, but are not limited to, actual and commanded compressor speed, actual and estimated inverter output power, actual and estimated drive output power, input and output current, drive input voltage, inverter output voltage, estimated motor torque, various temperatures, and a demand from the condenser 104. The various temperatures may include, for example, temperatures of the PFC circuit 212, the inverter power circuit 232, circuit boards, the compressor scroll, and the motor 236. By way of example, a look-up table may include a desired DC bus voltage $V_{DES}$ corresponding to possible AC peak voltages $V_{PEAK}$ and each of the different combinations of the plurality of system parameters. The desired voltage module 704 may determine the desired DC bus voltage using the look-up table. For values between entries of the look-up table, the desired voltage module 704 may determine the desired DC bus voltage using interpolation. Further example discussion regarding setting the desired DC bus voltage is provided in the U.S. Prov. App. titled "Power Factor Correction Circuits and Methods Including Partial Power Factor Correction Operation for Boost and Buck Power Converters," U.S. Prov. App. No. 62/323,498, tiled on Apr. 15, 2016, which is incorporated herein in its entirety.

A voltage control module 708 determines a difference between the desired DC bus voltage and the measured DC bus voltage. The voltage control module 708 determines a first current demand based on the difference. More specifically, the voltage control module 708 determines the first current demand based on adjusting the difference toward or to zero.

The voltage control module 708 applies a filter to the first current demand and determines an initial current demand based on the first and filtered current demands. The voltage control module 708 weights the contributions of the first and filtered current demands to the initial current demand based on the magnitude of the difference between the measured and desired DC bus voltages. More specifically, the voltage control module 708 applies a greater weight to the filtered current demand when the magnitude of the difference is low. The voltage control module 708 increases the weighting of the first current demand and decreases the weighting of the filtered current demand as the difference increases. The voltage control module 708 may, for example, set the initial current demand based on or equal to a sum of the (weighted) first and filtered current demands.

A current demand module 712 may apply a filter to the initial current demand, such as a notch filter. The current demand module 712 may also perform one or more signal processing functions to reduce noise in the initial current demand. The current demand module 712 multiplies the (filtered) initial current demand with a reference signal to produce a final current demand. While the example of the current demand module 712 filtering the initial current demand is provided, the current demand module may not filter the initial current demand in other examples. In such a case, the initial current demand may be multiplied with the reference signal to produce the final current demand.

A reference generation module 716 determines zero crossings of the AC line and the reference signal. Based on the zero crossings, the reference generation module 716 generates the reference signal to track the AC input voltage in phase and frequency. In this way, the final current demand follows the AC input voltage, for example, to maximize power factor.

A current control module 720 generates the switch control signal 408 to control switching of the switch 320. More specifically, the current control module 720 transitions the switch 320 to the open state when the measured current through the inductor 308 is greater than the final current demand through the inductor 308. The current control module 720 then maintains the switch 320 in the open state for a desired OFF period. The desired OFF period may be a fixed value or may be a variable. The current control module 720 transitions the switch 320 to the closed state until the measured current through the inductor 308 again becomes greater than the final current demand through the inductor 308. The current control module 720 may also generate the clamp control signal 410, as described above. While this example is discussed, the current control module 720 may alternatively transition the switch 320 from OFF to ON when the measured current becomes less than the final current demand, maintain the switch 320 ON for a (variable) desired ON period, and transition the switch 320 from ON to OFF once the desired ON period has passed. The desired ON period may be determined similarly to the desired OFF period.

Figure 9:
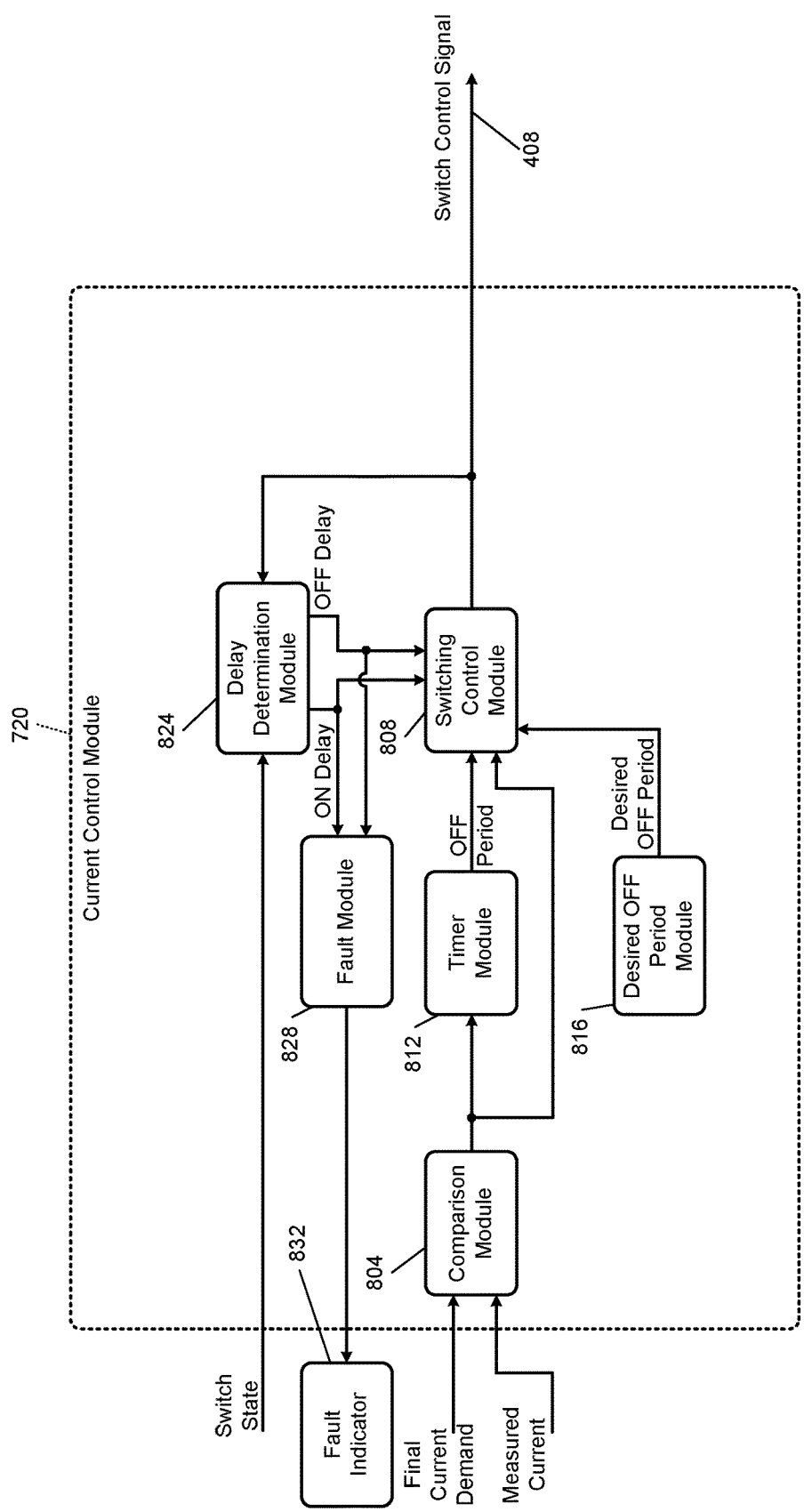
FIG. 9 is a functional block diagram of an example implementation of a current control module of the control module.

FIG. 9 is a functional block diagram of an example implementation of the current control module 720. The current control module 720 controls switching of the switch 320 based on a comparison of the final current demand through the inductor 308 with the measured current through the inductor 308. The measured current may be measured using the current sensor 312. The current control module 720 controls timing of the switching of the switch 320 considering measurement delays (e.g., of the current measurement) and other delays.

A comparison module 804 sets a comparison signal to a first state when the measured current is less than the final current demand. The comparison module 804 sets the comparison signal to a second state when the measured current is greater than the final current demand.

A switching control module 808 controls switching of the switch 320 based on the comparison of the measured current with the final current demand. More specifically, the switching control module 808 sets the switch control signal 408 based on the comparison of the measured current with the final current demand. For example, the switching control module 808 generates the switch control signal 408 to transition the switch 320 to the open state (OFF/not conducting) when the comparison signal transitions from the first state to the second state. The switching control module 808 generates the switch control signal 408 to maintain the switch 320 in the open state for a desired OFF period. More specifically, the switching control module 808 generates the switch control signal 408 to maintain the switch 320 in the open state until an OFF period is greater than the desired OFF period. The OFF period corresponds to the period since the switching control module 808 last generated the switch control signal 308 to transition the switch 320 to the open state.

A timer module 812 increments the OFF period when the comparison signal is in the second state. More specifically, the timer module 812 increments the OFF period when the switch 320 is OFF. In this manner, the OFF period tracks the period elapsed since the switching control module 808 last transitioned the switch 320 from ON to OFF (i.e., the measured current became greater than the final current demand). The timer module 1012 resets the OFF period when the switching control module 808 transitions the switch 320 from OFF to ON.

When the OFF period is greater than (or equal to) the desired OFF period, the switching control module 808 generates the switch control signal 408 to transition the switch 320 to the closed state (ON/conducting). The switching control module 808 then generates the switch control signal 408 to maintain the switch 320 in the closed state until the comparison signal is next in the second state. Under relatively steady state load conditions, the turning ON of the switch 320 may occur at approximately a beginning of a next predetermined switching period.

The predetermined switching periods ($t_p$) correspond to the predetermined switching frequency. As described above, the predetermined switching frequency may be at least 50 KHz and may be approximately 200 kilohertz (kHz) or another suitable frequency. The predetermined switching periods correspond to 1 divided by the predetermined switching frequency. The switching control module 808 may control the switch 320 to be in the closed state (conducting) and the open state (not conducting) for different portions of each predetermined switching period.

A desired OFF period module 816 may set the desired OFF period. For example only, the desired OFF period module 816 may set the desired OFF period to a predetermined fixed value. Alternatively, the desired OFF period module 816 may determine the desired OFF period based on one or more parameters. Further example discussion regarding determining the desired OFF period is provided in the U.S. Prov. App. titled "Switch Off Time Control Systems and Methods," U.S. Prov. App. No. 62,323,538 filed on Apr. 15, 2016, which is incorporated herein in its entirety. While the example of a sinusoidal AC input has been described, the present application is also applicable to other types of inputs including rectified inputs resulting from rectification of AC inputs.

The switching control module 808 also compensates for the turn ON delay period of the switch 320 and the turn OFF delay period of the switch 320. The turn ON delay period corresponds to the period between a first time when the switching control module 808 generates the switch control signal 408 to transition the switch 320 from the open state to the closed state and a second time when the switch 320 actually reaches the closed state (conductance) in response. The turn OFF delay period corresponds to the period between a first time when the switching control module 808 generates the switch control signal 408 to transition the switch 320 to the open state and a second time when the switch 320 actually reaches the open state (non-conductance) in response. The switch state signal from the switch monitoring circuit 328 is used to determine when the switch 320 reaches the open state and the closed state.

To account for the turn ON delay period, the switching control module 808 should hypothetically generate the switch control signal 408 to transition the switch 320 to the closed state before the OFF period reaches the desired OFF period. The switching control module 808 should also hypothetically generate the switch control signal 408 to transition the switch 320 to the open state before the current becomes greater than the final current demand due to the turn OFF delay period.

The switching control module 808 could adjust the desired OFF period based on the turn ON delay period and the turn OFF delay period. For example, the switching control module 808 could add the turn OFF delay period and subtract the turn ON delay period from the desired OFF period. This (adjusted) desired OFF period will be compared with the OFF period from the timer module 812 to determine when to transition the switch 320 to the closed state. The use of the (adjusted) desired OFF period may prevent switching too early.

Other alternatives for this compensation are also possible. For example, the switching control module 808 could generate the switch control signal 408 to transition the switch 320 to the open state when the measured current is greater than a current threshold that is less than the final current demand. The switching control module 808 could generate the switch control signal 408 to transition the switch 320 to the closed state when the turn ON delay period before the OFF period reaches the desired OFF period.

A delay determination module 824 determines the turn ON delay period and the turn OFF delay period. For example, the delay determination module 824 may reset and start a timer when the switching control module 808 generates the switch control signal 408 to transition the switch 320 from the open state to the closed state. The delay determination module 824 may monitor the switch state signal and set the turn ON delay period based on or to the period indicated by the timer when the switch state signal indicates that the switch 320 transitioned from the open state to the closed state.

The delay determination module 824 may reset and start a timer when the switching control module 808 generates the switch control signal 408 to transition the switch 320 from the closed state to the open state. The delay determination module 824 may monitor the switch state signal and set the turn OFF delay period based on or to the period indicated by the timer when the switch state signal indicates that the switch 320 transitioned from the closed state to the open state.

While the delay determination module 824 is shown as being implemented within the current control module 720, the delay determination module 824 may be implemented externally to the current control module 720 and may be implemented externally to the control module 220. Also, while the example of turning the switch 320 OFF when the measured current becomes greater than the final current demand and maintaining the switch 320 OFF for the desired OFF period thereafter, the switching control module 808 may alternatively turn the switch 320 ON for a desired ON period. More specifically, the switching control module 808 may turn the switch 320 ON when the measured current falls below the final current demand, maintain the switch 320 ON for a desired ON period, and turn the switch 320 OFF when the desired ON period has passed after the turning of the switch 320 ON. A desired ON period module (not shown) determines the desired ON period. Written generally, for a boost converter, the desired ON period module may determine the desired ON period based on the input voltage, the output voltage, and the predetermined switching period. The desired ON period module may determine the desired ON period using one of a function and a look-up table that relates input voltages and output voltages to desired ON times given the predetermined switching period. For values between entries of the look-up table, the desired ON period module 816 may determine the desired ON period using interpolation.

As an alternative to determining the turn ON delay period and the turn OFF delay period based on the switch state signal, the delay determination module 824 may retrieve the turn ON delay period and the turn OFF delay period from memory. In this example, the turn ON delay period and the turn OFF delay period may be predetermined values set/calibrated based on data sheet information.

As yet another alternative, the delay determination module 824 may determine a total delay period (inclusive of both the turn ON delay period and the turn OFF delay period). The delay determination module 824 may set the total delay period, for example, based on or equal to the period between consecutive instances when the switch control module 808 generates the switch control signal 408 to transition the switch 320 from the closed state to the open state. Alternatively, consecutive instances when the switch control module 808 generates the switch control signal 408 to transition the switch 320 from the open state to the closed state may be used. The switching control module 808 could adjust the desired OFF period based on the total delay period. For example, the switching control module 808 could subtract the total delay period from the desired OFF period or decrease the desired OFF period as a function of the total delay period.

In all of the above examples, the delay determination module 824 may limit the determined delay period(s) to between predetermined upper and lower limit values. Additionally, the delay determination module 824 may scale the one or more of determined delay period(s) and/or one or more components of one or more of the determined delay period(s), such as the turn OFF delay period and not the turn ON delay period, based on the input and output voltages and one or more predetermined scalar values. The delay determination module 824 may scale the one or more determined delay period(s) and/or one or more components of one or more of the determined delay period(s), for example, using one or more functions and/or mappings that relate the input voltage, the output voltage, and the one or more predetermined scalar values to scalar values. The delay determination module 824 may multiply a scalar value determined based on a given set of input voltage, output voltage, and predetermined scalar value(s) to the one or more determined delay period(s) and/or one or more components of one or more of the determined delay period(s). As an example only, the delay determination module 824 may determine scalar values using the relationship:

$$\frac{VAC}{(VDC - VAC)} * \text{Pred},$$

where VAC is the input voltage, VDC is the output voltage, and Pred is a predetermined scalar value. For example only, the predetermined scalar value may be 0.707 or another suitable value.

A fault module 828 may diagnose a switching fault based on the turn ON delay period, the turn OFF delay period, or the period tracked by the timers. For example, the fault module 828 may indicate that a switching fault has occurred when the turn ON delay period, the turn OFF delay period, or one of the periods tracked by the timers (to determine the turn ON and OFF delay periods) is greater than a predetermined period. The turn ON delay period (or the associated timer) being longer than the predetermined period may indicate that the switch 320 failed to transition to the closed state (or at least not fully closed/partially open, e.g., due to high current) within the predetermined period after controlled to do so. The turn OFF delay period (or the associated timer) being longer than the predetermined period may indicate that the switch 320 failed to transition to the open state within the predetermined period after controlled to do so.

The fault module 828 may take one or more remedial actions when a switching fault is diagnosed. For example, the fault module 828 may store an indicator of the presence of a switching fault in memory. Additionally or alternatively, the fault module 828 may illuminate a fault indicator 832 when a switching fault is diagnosed. Additionally or alternatively, the fault module 828 may generate the switch control signal 408 and the clamp control signal 410 to operate the switch 320 in the open state. The fault module 828 may take one or more other remedial actions additionally or alternatively when a switching fault is diagnosed.

Figure 10:
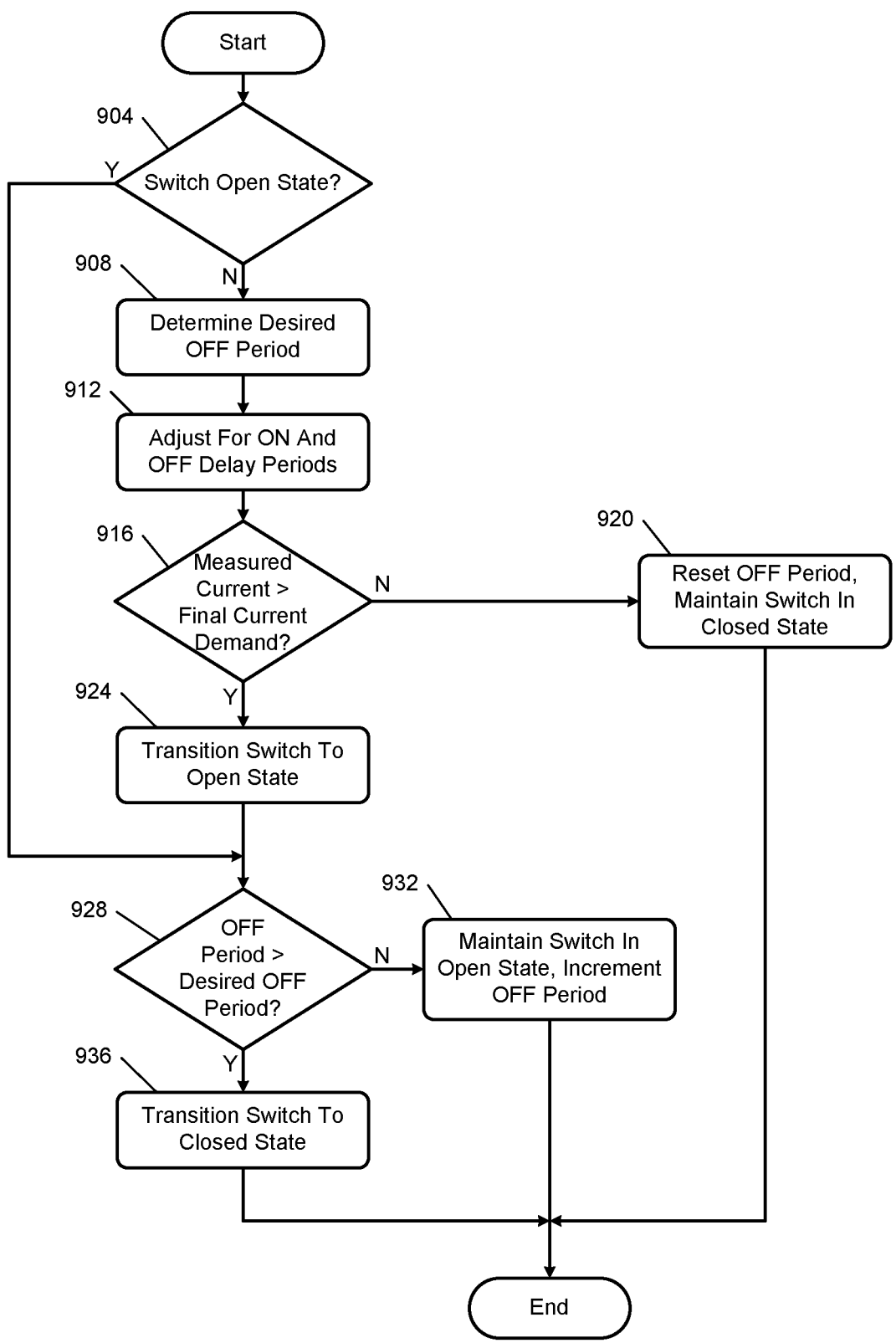
FIG. 10 is a flowchart depicting an example method of controlling switching of the switch of the power factor correction circuit.

FIG. 10 includes a flowchart depicting an example method of controlling the switch 320 based on the desired OFF period. Control begins with 904 where the switching control module 808 determines whether the switch 320 is in the open state. If 904 is true, control transfers to 928, which is discussed further below. If 904 is false, control continues with 908.

At 908, the desired OFF period module 816 determines the desired OFF period. At 912, the switching control module 808 may adjust the desired OFF period based on the turn ON delay period and the turn OFF delay period. For example, the switching control module 808 may sum the desired OFF period with the turn OFF delay period and subtract the turn ON delay period.

The comparison module 804 may determine whether the measured current is greater than the final current demand at 916. The determination of the final current demand is discussed above. If 916 is false, the timer module 812 resets the OFF period and the switching control module 808 maintains the switch 320 in the closed state at 920, and control ends. If 916 is true, control continues with 924.

The switching control module 808 generates the switch control signal 408 to transition the switch 320 to the open state at 924 when the measured current is greater than the final current demand. At 928, the switching control module 808 may determine whether the OFF period of the switch 320 is greater than the desired OFF period. If 928 is false, the switching control module 808 maintains the switch 320 in the open state at 932, and control ends. If 928 is true, the switching control module 808 generates the switch control signal 408 to transition the switch 320 to the closed state at 936, and control ends. In various implementations, the switching control module 808 may wait for, or ensure that, the measured current is less than the final current demand before generating the output signal to turn the switch 320 ON at 936. While control is shown as ending, the example of FIG. 10 is illustrative of one control loop and control may return to 904 for a next control loop.

Figure 11:
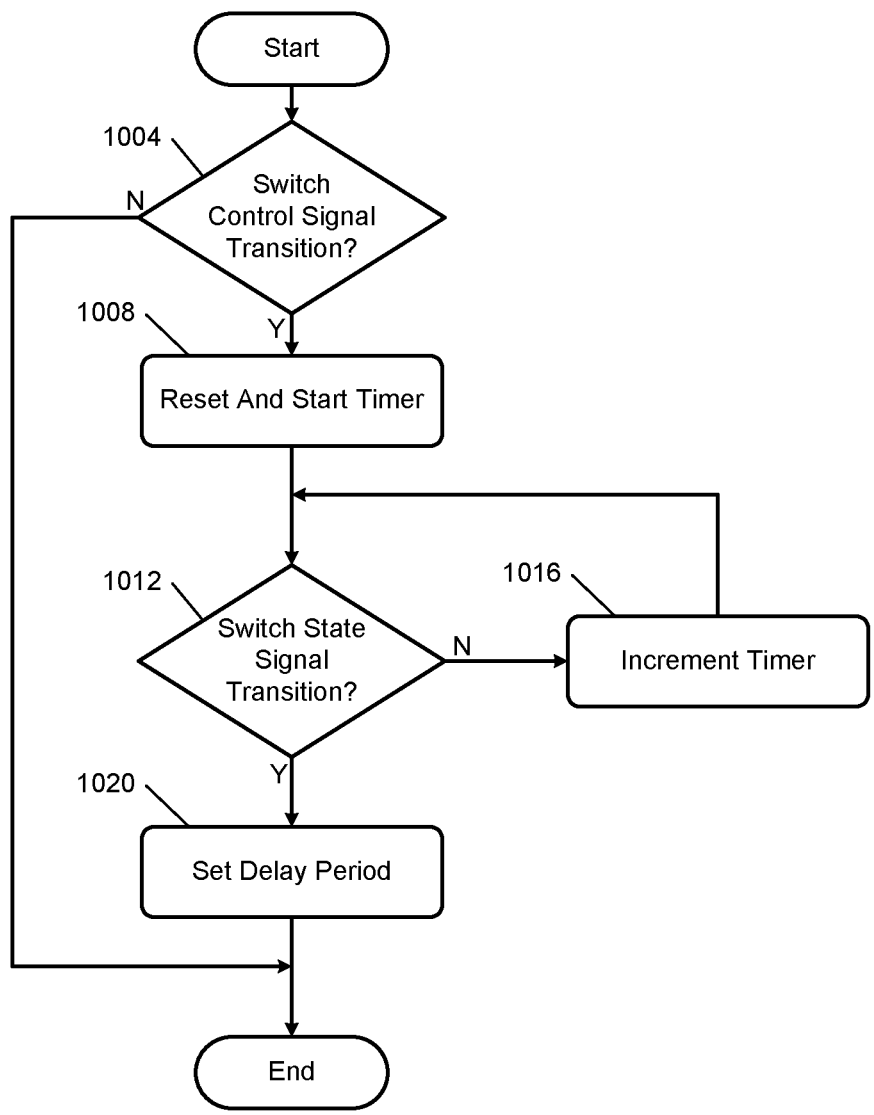
FIG. 11 is a flowchart depicting an example method of determining turn ON and turn OFF delays of the switch of the power factor correction circuit.

FIG. 11 is a flowchart including an example method of determining the turn ON or turn OFF delay period of the switch 320. Control begins with 1004 where the delay determination module 824 determines whether the switch control signal 408 has transitioned, such as to transition the switch 320 from the open state to the closed state. If 1004 is true, control continues with 1008. If 1004 is false, control may end.

At 1008, the delay determination module 824 may reset and start a timer. The timer therefore tracks the period since the switch control signal 408 transitioned. At 1012, the delay determination module 824 determines whether the switch state signal transitioned to the state associated with the transition in the switch control signal 408. If 1012 is false, the delay determination module 824 increments the timer at 1016 and returns to 1012. The fault module 828 may diagnose a switching fault and take one or more remedial actions when the timer is greater than the predetermined period. If 1012 is true, the delay determination module 824 may set the turn ON delay period or the turn OFF delay period based on or equal to the period tracked by the timer at 1020.

For example, when the switch control signal 408 was for transitioning the switch 320 from the open state to the closed state, the delay determination module 824 sets the turn ON delay period for the switch 320 based on the period of the timer. When the switch control signal 408 was for transitioning the switch 320 from the closed state to the open state, the delay determination module 824 sets the turn OFF delay period for the switch 320 based on the period of the timer. While control is shown as ending, the example of FIG. 11 is illustrative of one control loop and control may return to 1004 for a next control loop.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A drive, comprising:
an inverter power circuit that applies power to an electric motor of a compressor from a direct current (DC) voltage bus;
a power factor correction (PFC) circuit that outputs power to the DC voltage bus based on input alternating current (AC) power, the PFC circuit including:
(i) a switch having a first terminal, a second terminal, and a control terminal;
(ii) a driver that switches the switch between open and closed states based on a control signal;
(iii) an inductor that charges and discharges based on switching of the switch;

(iv) a circuit that outputs a signal indicating whether the switch is in the open state or the closed state based on a voltage across the first and second terminals of the switch;
(v) a node that is connected to a first voltage at the first terminal of the switch when the switch is in the closed state and that is connected to a second voltage when the switch is in the open state;
(vi) a first voltage divider that generates a third voltage based on a fourth voltage at the node;
(vii) a second voltage divider that generates a fifth voltage based on a sixth voltage at the second terminal of the switch; and
(viii) a comparator that generates the signal indicating whether the switch is in the open state or the closed state based on a comparison of the third voltage and the fifth voltage.

2. The drive of claim 1 further comprising a control module that generates the control signal based on the signal indicating whether the switch is in the open state or the closed state.

3. The drive of claim 2 wherein the control module measures a period between:
(i) a first time when the control signal transitions from a first state for transitioning the switch one of:
(a) from the open state to the closed state; and
(b) from the closed state to the open state; and
(i) a second time, after the first time, when the signal transitions from a first state to a second indicating that the one of:
(a) the switch transitioned from the open state to the closed state; and
(b) the switch transitioned from the closed state to the open state,
wherein the control module generates the control signal based on the period.

4. The drive of claim 1 wherein the circuit generates the signal indicating that the switch is in the closed state when the voltage across the first and second terminals of the switch is less than a predetermined voltage.

5. The drive of claim 1 wherein the circuit generates the signal indicating that the switch is in the open state when the voltage across the first and second terminals is greater than a predetermined voltage.

6. The drive of claim 1 wherein the second terminal of the switch is connected to a ground potential.

7. The drive of claim 1 wherein the comparator generates the signal indicating that the switch is in the open state when the third voltage is greater than the fifth voltage.

8. The drive of claim 1 wherein the comparator generates the signal indicating that the switch is in the closed state when the third voltage is less than the fifth voltage.

9. A method, comprising:
applying power to an electric motor of a compressor from a direct current (DC) voltage bus;
by a power factor correction (PFC) circuit, providing power to the DC voltage bus based on input alternating current (AC) power, the providing power to the DC bus voltage including switching a switch of the PFC circuit between open and closed states based on a control signal,
wherein the switch includes a first terminal, a second terminal, and a control terminal;
outputting a signal indicating whether the switch is in the open state or the closed state based on a voltage across the first and second terminals of the switch;
connecting a node to a first voltage at the first terminal of the switch when the switch is in the closed state;
connecting the node to a second voltage when the switch is in the open state;
by a first voltage divider, generating a third voltage based on a fourth voltage at the node; and
by a second voltage divider, generating a fifth voltage based on a sixth voltage at the second terminal of the switch,
wherein outputting the signal indicating whether the switch is in the open state or the closed state includes outputting the signal indicating whether the switch is in the open state or the closed state based on a comparison of the third voltage and the fifth voltage.

10. The method of claim 9 further comprising generating the control signal based on the signal indicating whether the switch is in the open state or the closed state.

11. The method of claim 10 further comprising measuring a period between:
(i) a first time when the control signal transitions from a first state for transitioning the switch one of:
(a) from the open state to the closed state; and
(b) from the closed state to the open state; and
(i) a second time, after the first time, when the signal transitions from a first state to a second indicating that the one of:
(a) the switch transitioned from the open state to the closed state; and
(b) the switch transitioned from the closed state to the open state,
wherein generating the control signal includes generating the control signal based on the period.

12. The method of claim 9 wherein outputting the signal indicating whether the switch is in the open state or the closed state includes generating the signal indicating that the switch is in the closed state when the voltage across the first and second terminals of the switch is less than a predetermined voltage.

13. The method of claim 9 wherein outputting the signal indicating whether the switch is in the open state or the closed state includes generating the signal indicating that the switch is in the open state when the voltage across the first and second terminals is greater than a predetermined voltage.

14. The method of claim 9 wherein the second terminal of the switch is connected to a ground potential.

15. The method of claim 9 wherein outputting the signal indicating whether the switch is in the open state or the closed state includes generating the signal indicating that the switch is in the open state when the third voltage is greater than the fifth voltage.

16. The method of claim 9 wherein outputting the signal indicating whether the switch is in the open state or the closed state includes generating the signal indicating that the switch is in the closed state when the third voltage is less than the fifth voltage.

* * * * *